United States Patent
Na et al.

(10) Patent No.: US 9,837,462 B2
(45) Date of Patent: Dec. 5, 2017

(54) WIDE SPECTRUM OPTICAL SENSOR

(71) Applicant: Artilux Corporation, Grand Cayman (KY)

(72) Inventors: Yun-Chung Na, Zhubei (TW); Szu-Lin Cheng, Zhubei (TW); Shu-Lu Chen, Zhubei (TW); Han-Din Liu, Sunnyvale, CA (US); Hui-Wen Chen, Zhubei (TW)

(73) Assignee: Artilux Corporation, Grand Cayman (KY)

( * ) Notice: Subject to any disclaimer, the term of this patent is extended or adjusted under 35 U.S.C. 154(b) by 0 days.

(21) Appl. No.: 15/248,618

(22) Filed: Aug. 26, 2016

(65) Prior Publication Data

US 2017/0062508 A1 Mar. 2, 2017

Related U.S. Application Data

(60) Provisional application No. 62/271,386, filed on Dec. 28, 2015, provisional application No. 62/251,691,
(Continued)

(51) Int. Cl.
*H01L 31/062* (2012.01)
*H01L 31/113* (2006.01)
(Continued)

(52) U.S. Cl.
CPC .... *H01L 27/14647* (2013.01); *H01L 27/1443* (2013.01); *H01L 27/14652* (2013.01);
(Continued)

(58) Field of Classification Search
CPC .............................................. H01L 27/14647
See application file for complete search history.

(56) References Cited

U.S. PATENT DOCUMENTS 4,604,527 A * 8/1986 Chenevas-Paule .. H04N 1/1931
257/E27.133
4,607,168 A * 8/1986 Oritsuki ............ H01L 27/14665
250/208.1
(Continued)

FOREIGN PATENT DOCUMENTS

EP 2330637 6/2011
JP 2000-133791 5/2000
(Continued)

OTHER PUBLICATIONS

International Search Report and Written Opinion in Intrnational Application No. PCT/US2016/045526, dated Nov. 22, 2016, 15 pages.
(Continued)

*Primary Examiner* — Sitaramarao S Yechuri
(74) *Attorney, Agent, or Firm* — Fish & Richardson P.C.

(57) ABSTRACT

An optical sensor including a semiconductor substrate; a first light absorption region formed in the semiconductor substrate, the first light absorption region configured to absorb photons at a first wavelength range and to generate photo-carriers from the absorbed photons; a second light absorption region formed on the first light absorption region, the second light absorption region configured to absorb photons at a second wavelength range and to generate photo-carriers from the absorbed photons; and a sensor control signal coupled to the second light absorption region, the sensor control signal configured to provide at least a first control level and a second control level.

21 Claims, 17 Drawing Sheets

Related U.S. Application Data filed on Nov. 6, 2015, provisional application No. 62/217,031, filed on Sep. 11, 2015, provisional application No. 62/216,344, filed on Sep. 9, 2015, provisional application No. 62/211,004, filed on Aug. 28, 2015, provisional application No. 62/210,991, filed on Aug. 28, 2015, provisional application No. 62/210,946, filed on Aug. 27, 2015.

(51) Int. Cl.
*H01L 27/146* (2006.01)
*H01L 27/144* (2006.01)
*H01L 31/028* (2006.01)
*H01L 31/0352* (2006.01)
*H01L 31/103* (2006.01)
*H01L 31/105* (2006.01)

(52) U.S. Cl.
CPC .... *H01L 31/028* (2013.01); *H01L 31/035281* (2013.01); *H01L 31/103* (2013.01); *H01L 31/105* (2013.01)

(56) References Cited

U.S. PATENT DOCUMENTS

| | | | |
|---|---|---|---|
| 6,958,194 B1 * | 10/2005 | Hopper | H01L 27/14647 257/291 |
| 2004/0121507 A1 | 6/2004 | Bude et al. | |
| 2005/0077588 A1 | 4/2005 | Kasuga | |
| 2005/0186759 A1 | 8/2005 | So | |
| 2005/0233495 A1 | 10/2005 | Yang et al. | |
| 2007/0187796 A1 | 8/2007 | Rafferty et al. | |
| 2008/0303058 A1 | 12/2008 | Mori et al. | |
| 2009/0050891 A1 | 2/2009 | Katoh | |
| 2009/0200589 A1 | 8/2009 | Qian et al. | |
| 2010/0184246 A1 | 7/2010 | Sakai | |
| 2011/0155893 A1 | 6/2011 | Endo et al. | |
| 2012/0080726 A1 | 4/2012 | Sakano | |
| 2012/0248514 A1 | 10/2012 | Korekado et al. | |
| 2013/0062522 A1 | 3/2013 | Jiang et al. | |
| 2013/0119234 A1 * | 5/2013 | Lee | H01L 31/103 250/208.1 |
| 2013/0248865 A1 | 9/2013 | Toriyama et al. | |
| 2014/0054444 A1 | 2/2014 | Sasaki | |
| 2014/0252437 A1 | 9/2014 | Oh et al. | |
| 2014/0285404 A1 | 9/2014 | Takano et al. | |
| 2015/0041761 A1 | 2/2015 | Cheng et al. | |
| 2015/0171146 A1 | 6/2015 | Ooki et al. | |
| 2016/0049476 A1 | 2/2016 | Rachmady et al. | |
| 2016/0172393 A1 | 6/2016 | Kim et al. | |
| 2016/0190304 A1 | 6/2016 | Morin et al. | |
| 2016/0381789 A1 | 12/2016 | Rogers et al. | |
| 2017/0025466 A1 | 1/2017 | Na et al. | |
| 2017/0040362 A1 | 2/2017 | Na et al. | |
| 2017/0084648 A1 * | 3/2017 | Liu | H01L 27/14614 |

FOREIGN PATENT DOCUMENTS

| | | |
|---|---|---|
| JP | 2003-225207 | 8/2003 |
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-128024 | 6/2011 |
| JP | 2012-146920 | 8/2012 |
| JP | 2015-194838 | 11/2015 |
| WO | WO 2013/104718 | 7/2013 |
| WO | WO 2014/085789 | 6/2014 |
| WO | WO 2014/197226 | 12/2014 |
| WO | WO 2015/104307 | 7/2015 |

OTHER PUBLICATIONS

International Search Report and Written Opinion in International Application No. PCT/US2016/048915, dated Nov. 22, 2016, 17 pages.

International Search Report and Written Opinion in International Application No. PCT/US2016/043609, dated Nov. 1, 2016, 21 pages.

International Search Report and Written Opinion in International Application No. PCT/US2016/060493, dated Jan. 10, 2017, 20 pages.

International Search Report and Written Opinion in International Application No. PCT/US2016/066073, dated Mar. 7, 2017, 16 pages.

* cited by examiner

WIDE SPECTRUM OPTICAL SENSOR

CROSS-REFERENCE TO RELATED APPLICATIONS

This patent application claims the benefit of U.S. Provisional Patent Application No. 62/210,946,filed Aug. 27, 2015,U.S. Provisional Patent Application No. 62/210,991, filed Aug. 28, 2015,U.S. Provisional Patent Application No. 62/211,004,filed Aug. 28, 2015,U.S. Provisional Patent Application No. 62/216,344,filed Sep. 9, 2015,U.S. Provisional Patent Application No. 62/217,031,filed Sep. 11, 2015,U.S. Provisional Patent Application No. 62/251,691, filed Nov. 6, 2015,and U.S. Provisional Patent Application No. 62/271,386,filed Dec. 28, 2015,which are incorporated by reference herein.

BACKGROUND

This specification relates to detecting light using a semiconductor based light absorption apparatus.

Light propagates in free space or an optical medium is coupled to a semiconductor based light absorption apparatus that converts an optical signal to an electrical signal for processing.

SUMMARY

A semiconductor based light absorption apparatus, such as a photodiode, may be used to detect optical signals and convert the optical signals to electrical signals that may be further processed by another circuitry. Such light absorption optical sensor may be used in consumer electronics products, image sensors, data communications, time-of-flight (TOF) applications, medical devices, security/surveillance, and many other suitable applications. Conventionally, silicon is used as an image sensor material, but silicon has a low optical absorption efficiency for wavelengths in the near-infrared (NIR) spectrum or longer. Other materials and/or material alloys such as germanium, germanium-silicon, or germanium-tin may be used as image sensor materials with innovative optical device structure design described in this specification. According to one innovative aspect of the subject matter described in this specification, a photodiode is formed using materials such as germanium or germanium-silicon to increase the speed and/or the sensitivity and/or the dynamic range and/or the operating wavelength range of the device. In one embodiment, photodiodes formed using germanium or germanium-silicon and photodiodes formed using silicon may be integrated on a common substrate to yield a photodiode array having a greater operating wavelength range.

In general, one innovative aspect of the subject matter described in this specification can be embodied in an optical that includes a semiconductor substrate; a first light absorption region formed in the semiconductor substrate, the first light absorption region configured to absorb photons at a first wavelength range and to generate photo-carriers from the absorbed photons; a second light absorption region on the first light absorption region, the second light absorption region configured to absorb photons at a second wavelength range and to generate photo-carriers from the absorbed photons; and a sensor control signal coupled to the second light absorption region, the sensor control signal configured to provide at least a first control level and a second control level. At the first control level, an energy band difference at an interface of the first light absorption region and the second light absorption region is above a threshold for blocking one specific polarity of the photo-carriers generated by the second light absorption region from entering the first light absorption region. At the second control level, the energy band difference at the interface of the first light absorption region and the second light absorption region is below the threshold for blocking the one specific polarity of the photo-carriers generated by the second light absorption region from entering the first light absorption region.

This and other implementations can each optionally include one or more of the following features. The first light absorption region may include an n-doped silicon region; and a p-doped silicon region on the n-doped silicon region. The second light absorption region may include an intrinsic region including germanium on the p-doped silicon region of the first light absorption region; and a p-doped region including germanium on the intrinsic region. The optical sensor may include an n-doped readout region coupled to a readout circuit; and a gate coupled to a gate control signal, the gate configured to control a carrier transit between the first light absorption region and the n-doped readout region. The second light absorption region may include a mesa including germanium. The second light absorption region may include a film including germanium.

Another innovative aspect of the subject matter described in this specification can be embodied in an optical sensor that includes a first diode formed using a first material, the first diode comprising an n-doped region and a p-doped region; a NMOS transistor that includes a source region coupled to the n-doped region of the first diode; a gate region coupled to a NMOS gate control signal; and a drain region; a second diode formed using a second material, the second diode including an n-doped region coupled to a first bias signal; and a p-doped region; and a PMOS transistor including a source region coupled to the p-doped region of the first diode and the p-doped region of the second diode; a gate region coupled to a PMOS gate control signal; and a drain region.

This and other implementations can each optionally include one or more of the following features. The drain region of the NMOS transistor may be coupled to a first readout circuit. The drain region of the PMOS transistor may be coupled to a second bias source, such that (i) the first readout circuit collects, stores, and processes electrons generated by the first diode, (ii) the drain region of the PMOS transistor transfers holes generated by the first diode to the second bias source, and (iii) the drain region of the PMOS transistor transfers holes generated by the second diode to the second bias source. The first diode may be configured to absorb light at visible wavelengths to generate electrons and holes.

The drain region of the PMOS transistor may be coupled to a second readout circuit. The drain region of the NMOS transistor may be coupled to a third bias source, such that (i) the drain region of the NMOS transistor transfers electrons generated by the first diode to the third bias source, (ii) the second readout circuit collects, stores, and processes holes generated by the first diode, and (iii) the second readout circuit collects, stores, and processes holes generated by the second diode. The second diode may be configured to absorb light at near-infrared or infrared wavelengths to generate electrons and holes.

The optical sensor may further include a substrate, where the first diode, the NMOS transistor, and the PMOS transistor are formed in the substrate. The second diode may further include an intrinsic region, where the p-doped region of the second diode is on the p-doped region of the first diode, where the intrinsic region of the second diode is on the p-doped region of the second diode, and where the n-doped region of the second diode is on the intrinsic region of the second diode. The first diode may be a diode including silicon and the second diode may be a diode including germanium.

Another innovative aspect of the subject matter described in this specification can be embodied in an optical sensor that includes a semiconductor substrate; a first light absorption region formed in the semiconductor substrate, the first light absorption region configured to absorb photons at a first wavelength range and to generate photo-carriers from the absorbed photons, the first light absorption region including: a first carrier-collection region configured to collect electrons; and a second carrier-collection region configured to collect holes; a second light absorption region on a portion of the first light absorption region, the second light absorption region configured to absorb photons at a second wavelength range and to generate photo-carriers from the absorbed photons; a first readout region coupled to a first readout circuitry, the first readout region configured to provide the electrons collected by the first carrier-collection region to the first readout circuitry, where the electrons collected by the first carrier-collection region are provided by the first light absorption region; a first gate coupled to a first control signal that controls a carrier transport between the first carrier-collection region and the first readout region; a second readout region coupled to a second readout circuitry, the second readout region configured to provide the holes collected by the second carrier-collection region to the second readout circuitry, where the holes collected by the second carrier-collection region are provided by the second light absorption region; and a second gate coupled to a second control signal that controls a carrier transport between the second carrier-collection region and the second readout region.

This and other implementations can each optionally include one or more of the following features. The second light absorption region may include a p-doped region including germanium on the first light absorption region; an intrinsic region including germanium on the p-doped region; and an n-doped region including germanium on the intrinsic region. The p-doped region may have a first strain and a first area, and the intrinsic region may have a second strain that is lower than the first strain, and the intrinsic region may have a second area that is larger than the first area.

The second light absorption region may be on a portion of the second carrier-collection region but not on the first carrier-collection region. The first light absorption region and the second light absorption region may be configured to receive light at different locations. The first light absorption region and the second light absorption region may be coupled by one or more interconnects formed by bonding two donor wafers.

The optical sensor may include a third readout region coupled to a third readout circuitry, the third readout region configured to provide the holes collected by the second carrier-collection region to the third readout circuitry; and a third gate coupled to a third control signal that controls a carrier transport between the second carrier-collection region and the third readout region. The optical sensor may include a fourth readout region coupled to a fourth readout circuitry, the fourth readout region configured to provide the holes collected by the second carrier-collection region to the fourth readout circuitry; and a fourth gate coupled to a fourth control signal that controls a carrier transport between the second carrier-collection region and the fourth readout region.

Advantageous implementations may include one or more of the following features. Germanium is an efficient absorption material for near-infrared wavelengths, which reduces the problem of slow photo-carriers generated at a greater substrate depth when an inefficient absorption material, e.g., silicon, is used. An increased device bandwidth allows the use of a higher modulation frequency in an optical sensing system, giving advantages such as a greater depth resolution and a higher frame rate with innovative device design. An alloy germanium-silicon material as the optical absorption layer with innovative device design provides higher optical absorption efficiency over conventional Si material, which may provide a more sensitive sensor in the visible and near-infrared spectrums, may reduce crosstalk between neighboring pixels, and may allow for a reduction of pixel sizes. A punch-through (or reach-through) sensor design may enable a single-pixel photodiode or an array-pixel photodiodes to detect light in both the visible and near-infrared spectrums. A hybrid sensor design may support time-of-flight (TOF), near-infrared, and visible image sensing within the same sensing array. An increased device bandwidth allows the use of a higher modulation frequency in a time-of-flight system, giving a greater depth resolution. The punch-through sensor design and the hybrid sensor design may be controlled to prevent dark currents from the germanium-silicon region to leak into the silicon region and so avoids performance degradation. Having one sensor with two modes (e.g., VIS and NIR modes) instead of needing two separate sensors may reduce manufacturing cost, may increase the number of usable pixels in a given area, and may reduce packaging complexity.

The details of one or more implementations are set forth in the accompanying drawings and the description below. Other potential features and advantages will become apparent from the description, the drawings, and the claims.

BRIEF DESCRIPTION OF THE DRAWINGS

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1:
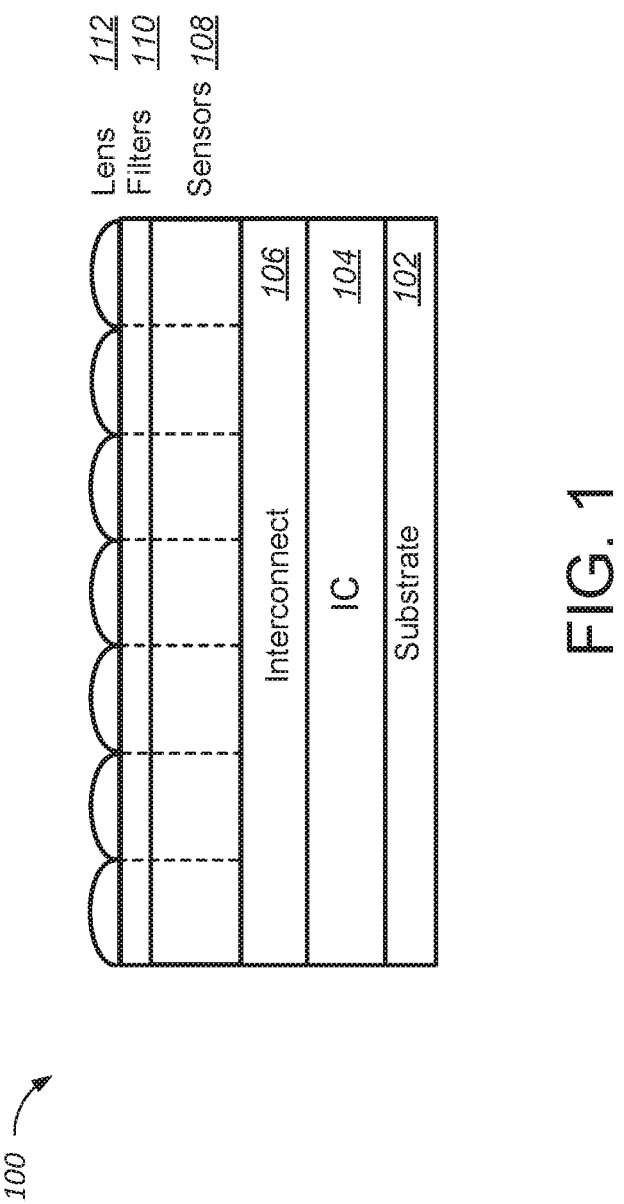
FIG. 1 is an example of a photodiode array.

Semiconductor based optical sensors, such as photodiodes may be used to detect optical signals and convert the optical signals to electrical signals that may be further processed by another circuitry. In general, a material absorbs light at various wavelengths to generate free carriers depending on an energy bandgap associated with the material. For example, at room temperature, silicon (Si) may have an energy bandgap of 1.12 eV. As another example, at room temperature, germanium (Ge) may have an energy bandgap of 0.66 eV, and a germanium-silicon alloy ($Ge_xSi_{1-x}$) may have an energy bandgap between 0.66 eV and 1.12 eV depending on the composition. As another example, at room temperature, tin (Sn) may have an energy bandgap of about 0 eV, and a germanium-tin alloy ($Ge_xSn_{1-x}$) may have an energy bandgap between 0 eV and 0.66 eV depending on the composition. In general, a material having a lower energy bandgap has a higher absorption coefficient at wider wavelength ranges. If the absorption coefficient of a material is too low, the optical signal cannot be converted to an electrical signal efficiently. However, if the absorption coefficient of a material is too high, free carriers will be generated near the surface of the material with reduced efficiency. Silicon is not an efficient sensor material for NIR wavelengths due to its large bandgap. On the other hand, germanium or tin has an absorption coefficient that may be too high for shorter wavelengths (e.g., blue), where free carriers may recombine at the surface. An optical sensor that integrates silicon and a different material, such as germanium or germanium-silicon, germanium-tin, on a common substrate, where the optical sensor uses silicon to detect visible light and uses the different material to detect NIR light, would enable the optical sensor to have a wide detection spectrum. In this application, the term "photodiode" may be used interchangeably as the term "optical sensor". In this application, the term "germanium-silicon (GeSi)", "silicon-germanium (SiGe)" may be used interchangeably, and both include all suitable SiGe composition combinations from 100% germanium (Ge) to more than 90% silicon (Si). In this application, the term "germanium-tin (GeSn)" includes all suitable GeSn composition combinations from 100% germanium (Ge) to more than 90% tin (Sn). In this application, the GeSi layer may be formed using blanket epitaxy, selective epitaxy, or other applicable techniques. Furthermore, the GeSi layer may be formed on a planar surface, a mesa surface, or a trench/hole region at least partially surround be insulator (ex: oxide, nitride), or semiconductor (ex: Si, Ge), or their combinations. Also note that in this application, lightly doped region may have doping level from $10^{15}$ to $10^{19}$ cm$^{-3}$. Furthermore, a strained super lattice structure including multiple layers such as alternating GeSi layer with different compositions may be used for the absorption or forming a quantum well structure.

FIG. 1 is an example a photodiode array 100 where photodiodes are formed by integrating silicon with germanium-silicon. An optical image sensor array is an example of a photodiode array. The photodiode array 100 includes a substrate 102, an integrated circuit layer 104, an interconnect layer 106, a sensor layer 108, a filter layer 110, and a lens layer 112. In general, light of a single wavelength or multiple wavelengths enters the lens layer 112, where the light may be focused, collimated, expanded, or processed according to the lens design. The shape of the lens could be concave, convex, or planar with surface structure such as Fresnel lens, or other shapes, and its shape should not be limited by the exemplary drawings here.

The light then enters the filter layer 110, where the filter layer 110 may be configured to pass light having one or more specific wavelength ranges. A filter may be formed by depositing layers of dielectric materials, such that light having a wavelength within a specific wavelength range would pass through the filter and light having a wavelength outside the specific wavelength range would be reflected by the filter. For example, a filter of the filter layer 110 may be configured to pass light at a blue wavelength range (e.g., 460 nm±40 nm) and a NIR wavelength range (e.g., 850 nm±40 nm, 940 nm±40 nm, or >1 µm), while another filter of the filter layer 110 may be configured to pass light at a green wavelength range (e.g., 540 nm±40 nm) and the NIR wavelength range. In some implementation, one or more filters of the filter layer 110 may pass wavelengths in a tunable fashion by including a capacitive microelectromechanical systems (MEMS) structure. The photodiodes in the sensor layer 108 converts the incident light into free carriers. The integrated circuit layer 104 collects the free carriers through the interconnect layer 106 and processes the free carriers according to the specific application.

In general, the substrate 102 may be a silicon substrate, a silicon-on-insulator (SOI) substrate, or any other suitable carrier substrate materials. The integrated circuits of the integrated circuit layer 104 and the interconnects of the interconnect layer 106 may be fabricated using CMOS processing techniques. For example, the interconnects may be formed by dry-etching a contact region through a dielectric layer in the form of holes or trenches and filling the contact region by copper using electroplating process.

The sensor layer 108 includes multiple photodiodes for detecting visible and/or NIR light. Each photodiode may be isolated by insulating sidewall spacers, trenches, or other suitable isolation structures. In some implementations, the wavelength range that a photodiode is configured to detect may be controlled by an optical filter in the filter layer 110. For example, a photodiode may be configured to receive a red wavelength range (e.g., 620 nm±40 nm) and a NIR wavelength range, where the center wavelengths and the limits of the wavelength ranges are controlled by the characteristics of the filter above the photodiode. In some implementations, the wavelength range that a photodiode is configured to detect may be controlled by a material composition of the photodiode. For example, an increase in germanium composition in a germanium-silicon alloy may increase the sensitivity of the photodiode at longer wavelengths. In some implementations, the wavelength range that a photodiode is configured to detect may be controlled by a combination of the optical filter and the material composition of the photodiode.

Figure 2:
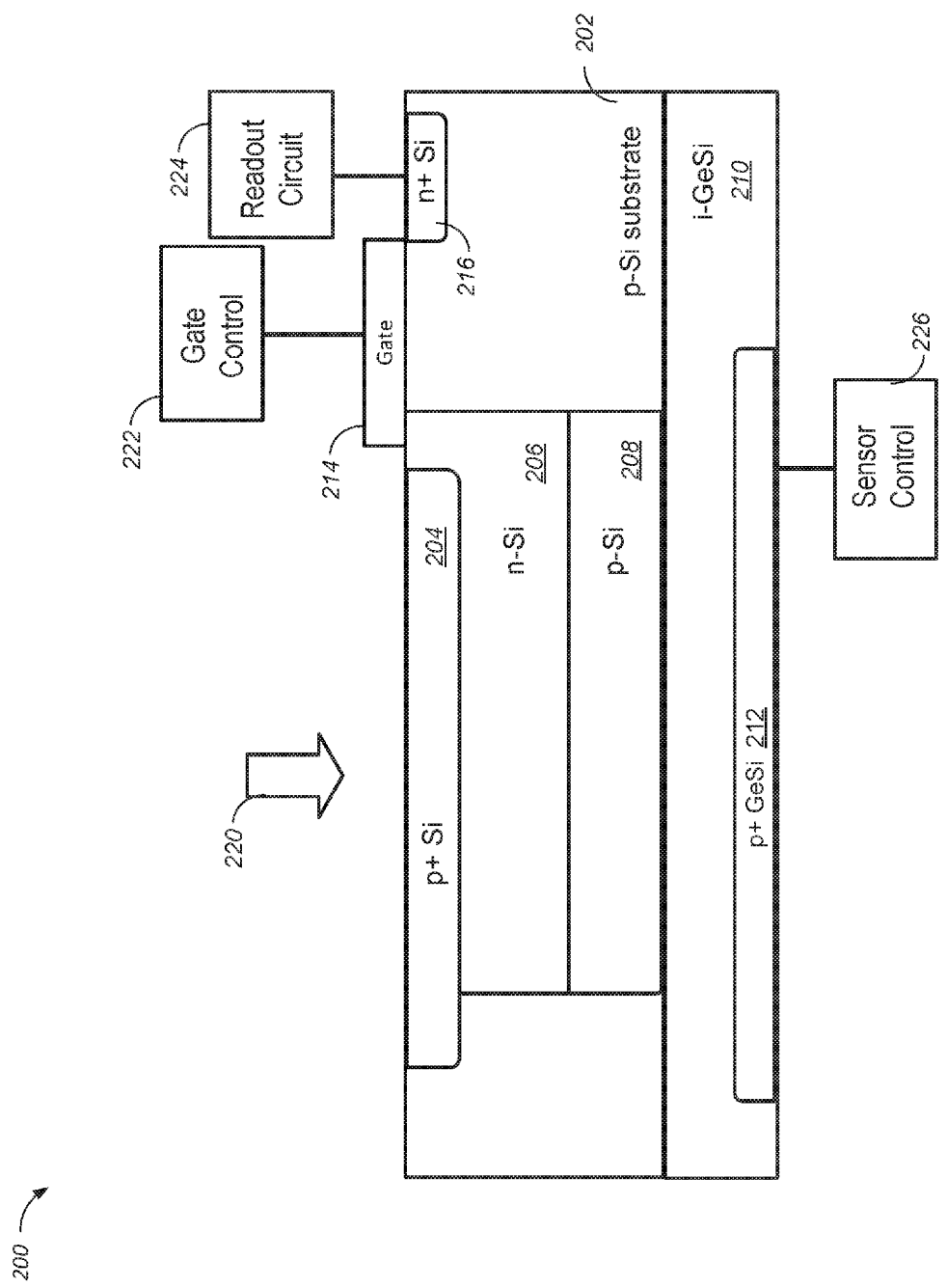
FIGS. 2-4 are examples of a photodiode having a punch-through structure for detecting visible and/or NIR light.
Figure 3:
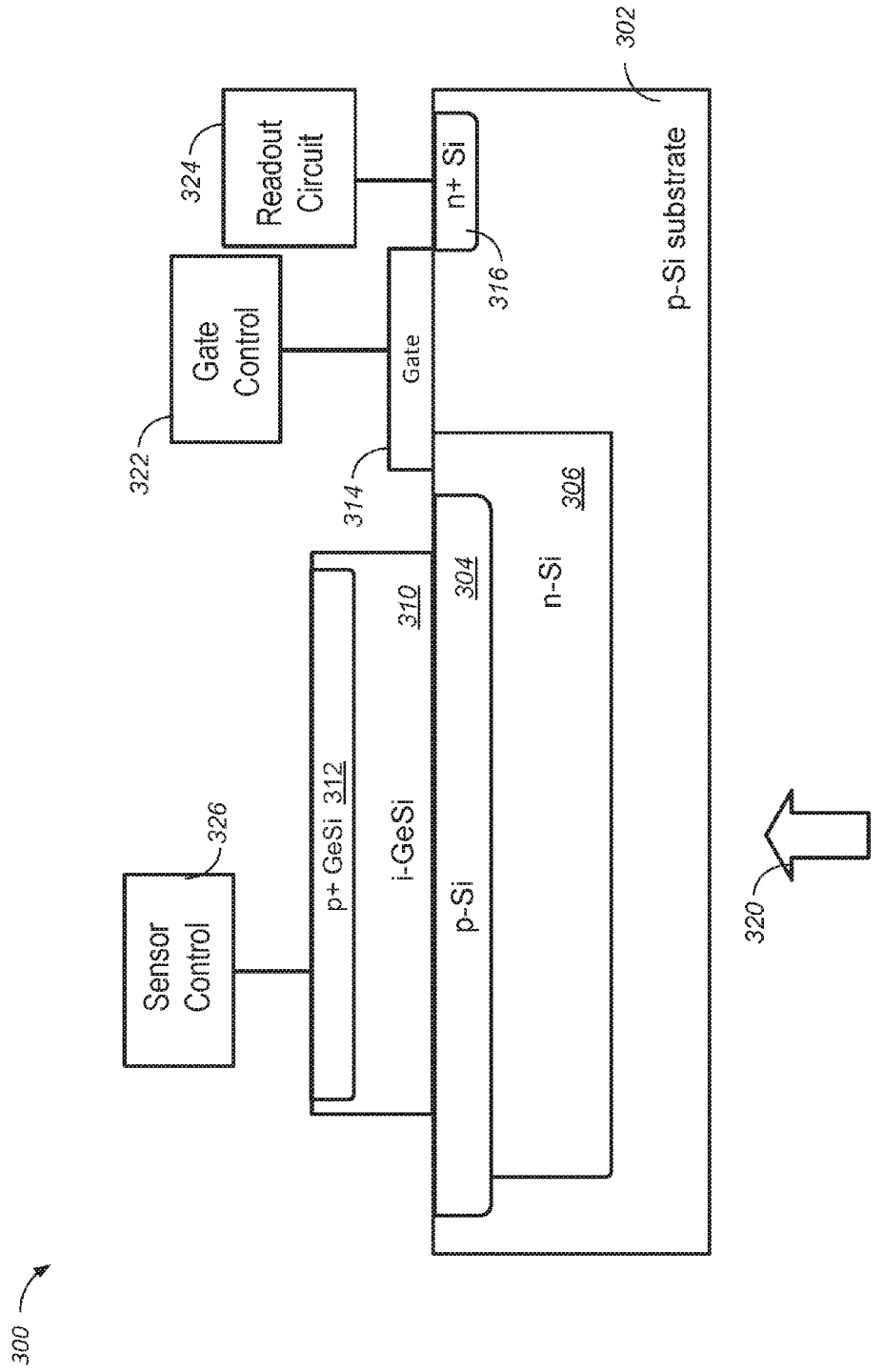
Figure 4:
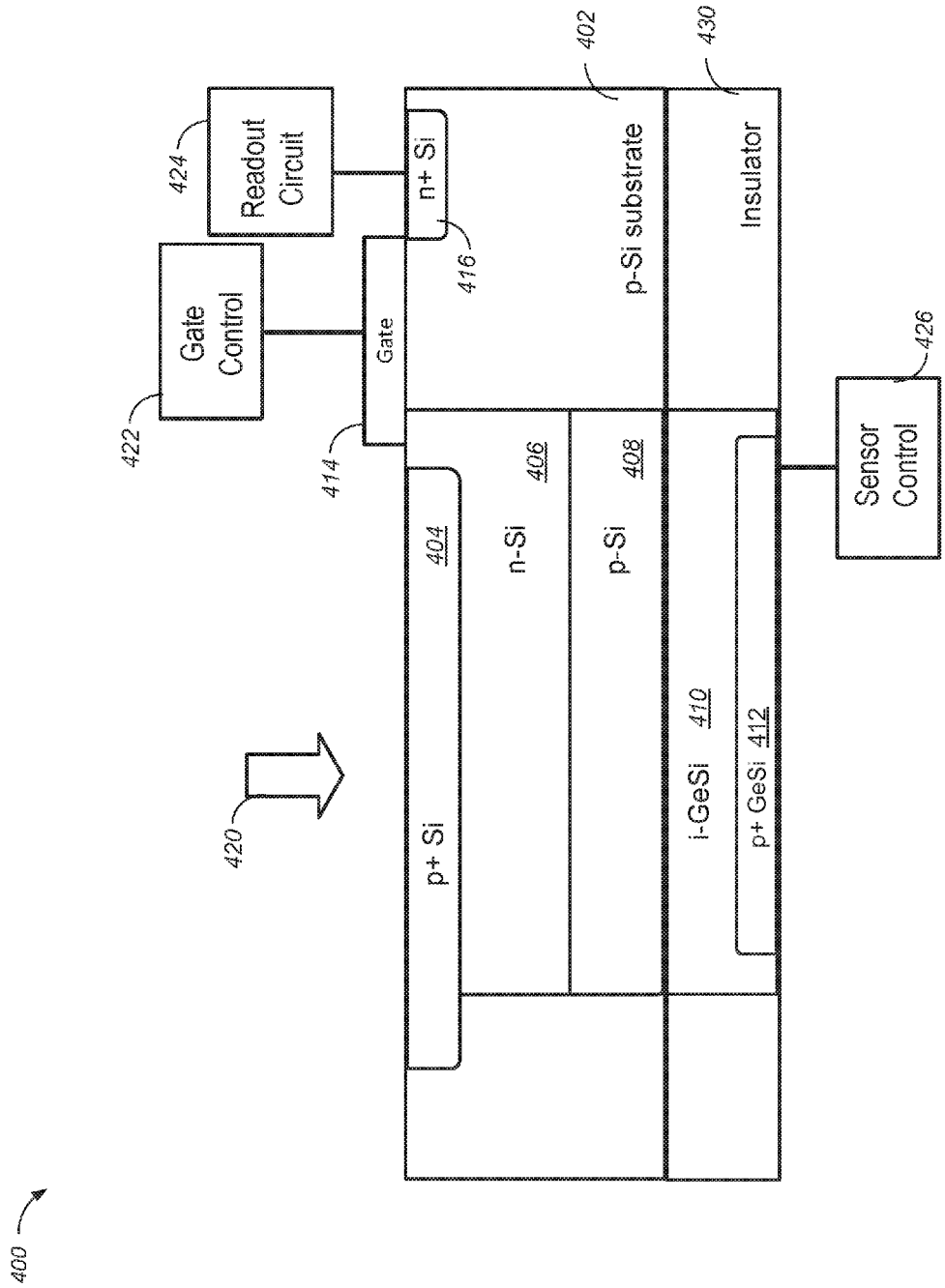

As described in more details in reference to FIGS. 2-4, in some implementations, the photodiodes in the photodiode array 100 may be controlled to transfer photo-carriers generated by either the visible or the NIR light to a readout circuit for further processing. For example, the photodiodes in the photodiode array 100 may be controlled to transfer photo-carriers generated by the visible light to the readout circuit for further processing during daytime, and the photodiodes may be controlled to transfer photo-carriers generated by the NIR light to the readout circuit for further processing during night time for night-vision applications. As another example, the optical sensor can be controlled to collect both the visible light and the NIR light simultaneously or in an alternating sequence.

As described in more details in reference to FIGS. 5-10, in some implementations, the photodiodes in the photodiode array 100 may be controlled to transfer photo-carriers generated by either the visible or the NIR light to different readout circuits for further processing. For example, the photodiodes in the photodiode array 100 may be controlled to transfer free-electrons generated by the visible light to a first readout circuit and to transfer free-holes generated by the NIR light to a second readout circuit for further processing. As another example, the optical sensor can be controlled to collect both the visible light and the NIR light simultaneously or in an alternating sequence.

Figure 13:
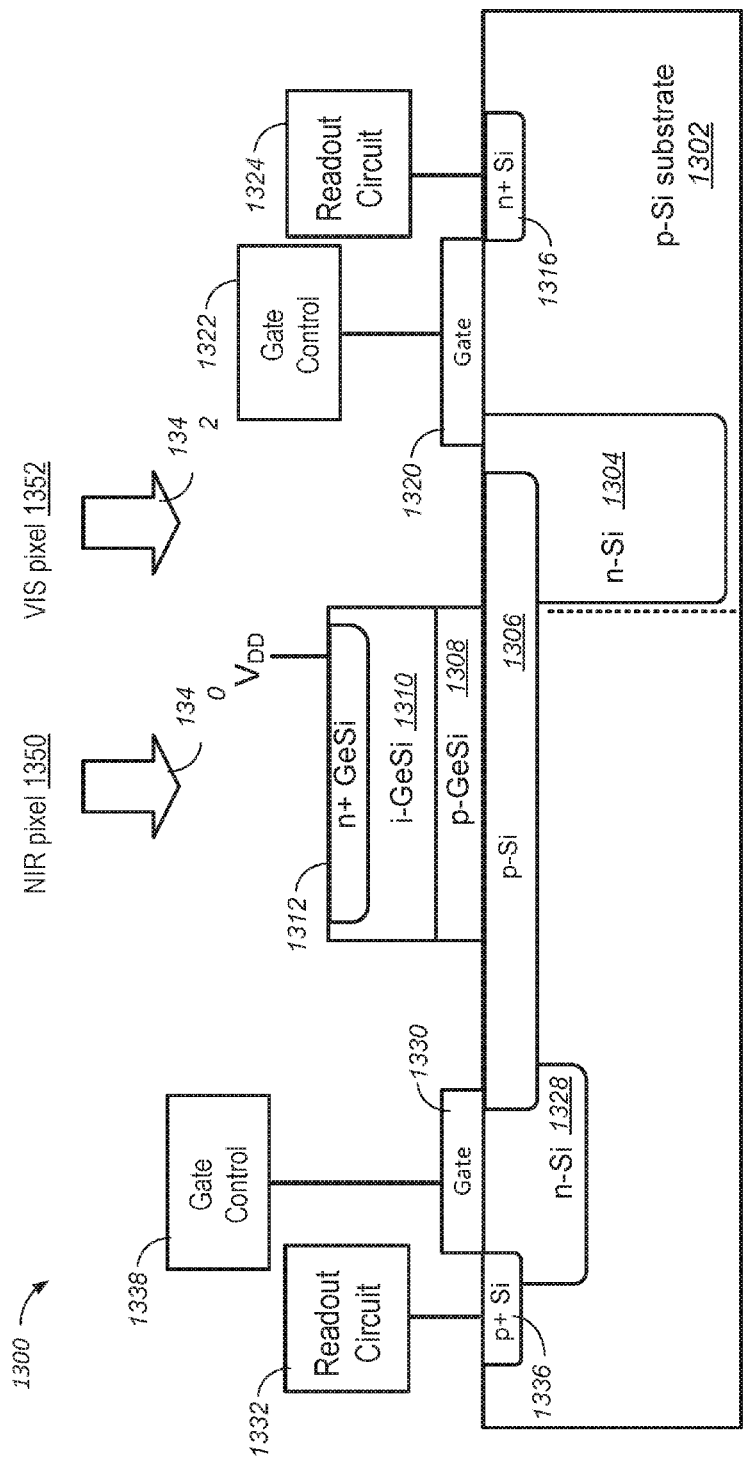
FIGS. 13-14 are examples of a multi-gate photodiode for detecting visible and/or NIR light.
Figure 14:
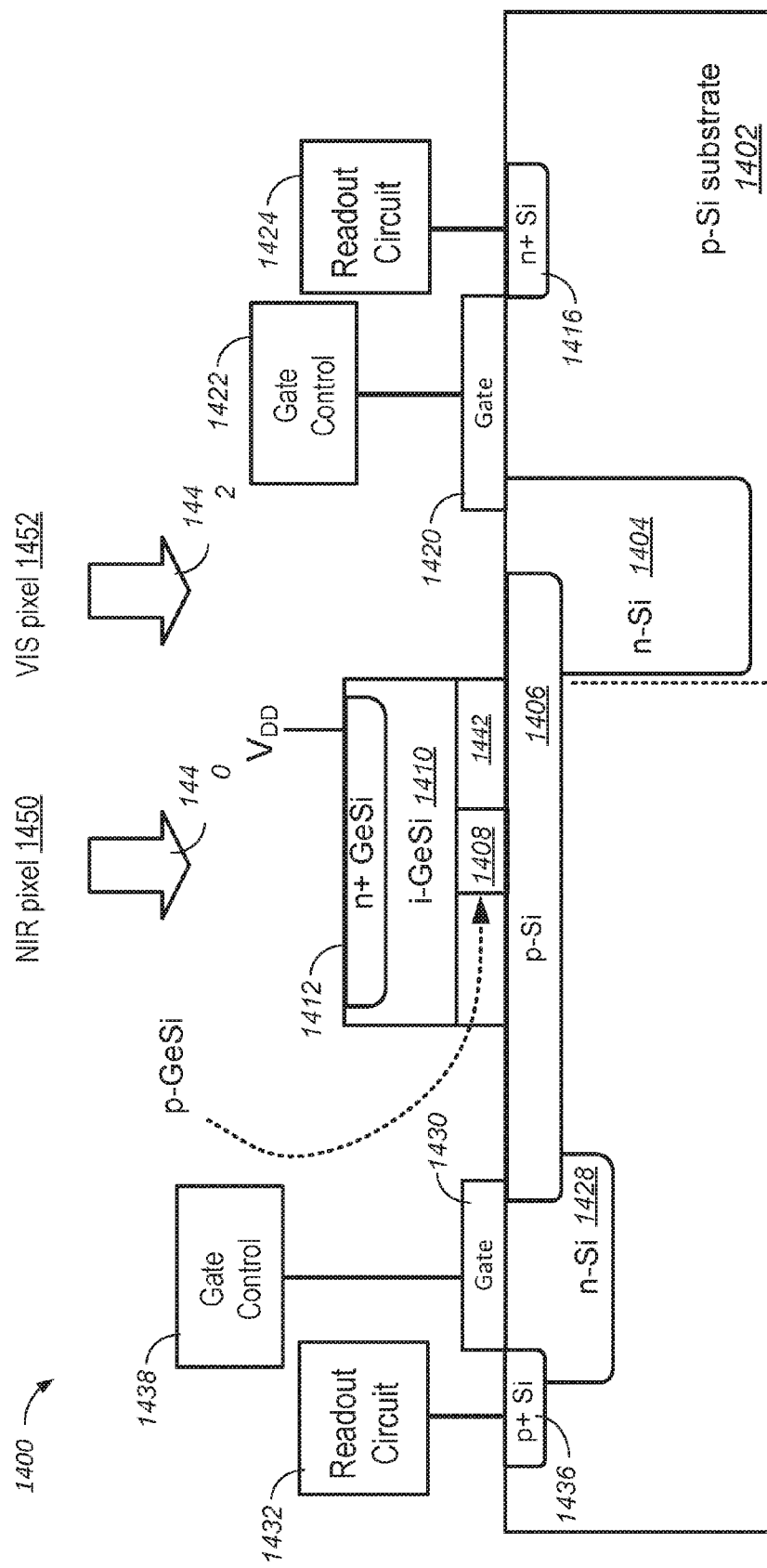

As described in more details in reference to FIGS. 13-14, in some implementations, different photodiodes in the photodiode array 100 may be controlled to detect the visible and/or the NIR light. For example, one pixel of the photodiodes in the photodiode array 100 may be controlled to transfer free-electrons generated by the visible light to a first readout circuit, while another pixel of the photodiode in the photodiode array 100 may be controlled to transfer free-holes generated by the NIR light to a second readout circuit for further processing. In some implementations, both pixels may share part of the structures such as the doping region.

FIG. 2 illustrates an example photodiode 200 having a punch-through structure for detecting visible and near-infrared optical signals. In general, the example photodiodes 200 includes a first absorption region for converting a visible optical signal to photo-carriers (i.e., electron-hole pairs) and a second absorption region for converting a NIR optical signal to photo-carriers. A sensor control signal 226 may control the transfer of either photo-carriers generated by the visible optical signal or photo-carriers generated by the NIR optical signal to the readout circuit 224. The photodiode 200 may be one of the photodiodes in the sensor layer 108 as described in reference to FIG. 1, for example.

The photodiode 200 includes a p-Si substrate 202, a p+ Si region 204, an n-si region 206, a p-Si region 208, an intrinsic GeSi region 210, a p+ GeSi region 212, a gate 214, an n+ Si region 216, a gate control signal 222 coupled to the gate 214, a sensor control signal 226 coupled to the p+ GeSi region 212, and a readout circuit 224 coupled to the n+ Si region 216. In some implementations, the first absorption region for converting a visible optical signal to photo-carriers may include the p+ Si region 204, the n-Si region 206, and the p-Si region 208. The p+ Si region 204 may have a p+doping, where the activated dopant concentration may be as high as a fabrication process may achieve, e.g., about $5 \times 10^{20}$ cm$^{-3}$ with boron. The n-Si region 206 may be lightly doped with an n-dopant, e.g., phosphorus. The p-Si region 208 may be lightly doped with a p-dopant, e.g., boron. In some implementations, the second absorption region for converting a NIR optical signal to photo-carriers may include the intrinsic GeSi region 210 and the p+ GeSi region 212. The p+ GeSi region 212 may have a p+doping, where the dopant concentration may be as high as a fabrication process may achieve, e.g., about $5 \times 10^{20}$ cm$^{-3}$ when the intrinsic GeSi region 210 is germanium and doped with boron. Here, the intrinsic GeSi region 210 is a germanium-silicon film. The p-Si substrate 202 may be lightly doped with a p-dopant, e.g., boron.

In general, the first absorption region of the photodiode 200 receives the optical signal 220. The optical signal 220 may be a visible optical signal or an NIR optical signal. In some implementations, the optical signal 220 may be filtered by a wavelength filter not shown in this figure, such as a filter in the filter layer 110 as described in reference to FIG. 1. In some implementations, a beam profile of the optical signal 220 may be shaped by a lens not shown in this figure, such as a lens in the lens layer 112 as described in reference to FIG. 1. In the case where the optical signal 220 is a visible optical signal, the first absorption region may absorb the visible optical signal and generate photo-carriers. In the case where the optical signal 220 is a NIR optical signal, the first absorption region may be transparent or nearly transparent to the NIR optical signal, and the second absorption region may absorb the NIR optical signal and generate photo-carriers. The sensor control signal 226 may control whether the photodiode 200 operates in a visible light mode or in a NIR light mode when a tunable wavelength filter is applied.

In the visible light mode, the optical signal 220 is a visible optical signal, where the first absorption region absorbs the visible optical signal and generates photo-carriers. A built-in potential between the p+ Si region 204 and the n-Si region 206 creates an electric field between the two regions, where free electrons generated from the n-Si region 206 are drifted/diffused to a region below the p+ Si region 204 by the electric field. The p-Si region 208 is configured to repel the free-electrons in the intrinsic GeSi region 210 from entering the first absorption region, such that the dark current of the photodiode 200 may be reduced. The sensor control signal 226 is configured to be able to apply a first sensor control signal level to further prevent free-electrons in the intrinsic GeSi region 210 from entering the first absorption region, such that the dark current of the photodiode 200 may be further reduced. For example, the p+ GeSi region 212 may be coupled to a voltage source, where the sensor control signal 226 may be a time-varying voltage signal from the voltage source. The first sensor control signal level may be 0V, such that an energy band difference between the p-Si region 208 and the intrinsic GeSi region 210 further prevents free-electrons in the intrinsic GeSi region 210 from entering the p-Si region 208. In some implementations, an intrinsic Si layer or unintentionally doped Si layer may be inserted in between the n-Si layer 206 and p-Si layer 208 to increase the optical absorption of the first absorption region.

The gate 214 may be coupled to the gate control signal 222. For example, the gate 214 may be coupled to a voltage source, where the gate control signal 222 may be a time-varying voltage signal from the voltage source. The gate control signal 222 controls a flow of free electrons from the region below the p+ Si region 204 to the n+ Si region 216. For example, if a voltage of the gate control signal 222 exceeds a threshold voltage, free electrons accumulated in the region below the p+ Si region 204 will drift or diffuse to the n+ Si region 216.

The n+ Si region 216 may be coupled to the readout circuit 224. The readout circuit 224 may be in a three-transistor configuration consisting of a reset gate, a source-follower, and a selection gate, or any suitable circuitry for processing free carriers. In some implementations, the readout circuit 224 may be fabricated on a substrate that is common to the photodiode 200. In some other implementations, the readout circuit 224 may be fabricated on another substrate and co-packaged with the photodiode 200 via die/wafer bonding or stacking. For example, the readout circuit 224 may be fabricated on the integrated circuit layer 104 as described in reference to FIG. 1.

In the NIR light mode, the optical signal 220 is a NIR optical signal, where the optical signal 220 passes through the first absorption region because of the low NIR absorption coefficient of silicon, and the second absorption region then absorbs the NIR optical signal to generate photo-carriers. In general, the intrinsic GeSi region 210 receives an optical signal 220 and converts the optical signal 220 into electrical signals. In some implementations, a thickness of the intrinsic GeSi region 210 may be between 0.05 μm to 2 μm. In some implementations, the intrinsic GeSi region 210 may include a p+ GeSi region 212. The p+ GeSi region 212 may repel the photo-electrons generated from the intrinsic GeSi region 210 to avoid surface recombination and thereby may increase the carrier collection efficiency.

In the NIR light mode, the sensor control signal 226 is configured to apply a second sensor control signal level to allow free-electrons in the intrinsic GeSi region 210 to enter the first absorption region. For example, the second sensor control signal level may be −1.2V, such that the p−Si region 208 is depleted, and the free-electrons in the intrinsic GeSi region 210 may enter the n−Si region 206 and drift or diffuse to below the p+ Si region 204. The free-electrons accumulated in the region below the p+ Si region 204 may be transferred to the readout circuit 224 by controlling the gate control signal 222 in similar manners as described earlier in reference to the visible mode.

Although not shown in FIG. 2, in some other implementations, the first absorption region and the second absorption region of the photodiode 200 may alternatively be designed into opposite polarity to collect holes. In this case, the p−Si substrate 202 would be replaced by an n−Si substrate, the p+ Si region 204 would be replaced by an n+ Si region, the n−Si region 206 would be replaced by a p−Si region, the p−Si region 208 would be replaced by an n−Si region, the p−Si substrate 202 would be replaced by an n−Si substrate, the n+ Si region 216 would be replaced by a p+ Si region, and the p+ GeSi region 212 would be replaced by an n+ GeSi region.

FIG. 3 illustrates an example photodiode 300 having a punch-through structure for detecting visible and near-infrared optical signals. In general, the example photodiodes 300 includes a first absorption region for converting a visible optical signal to photo-carriers and a second absorption region for converting a NIR optical signal to photo-carriers. A sensor control signal 326 may control the transfer of either photo-carriers generated by the visible optical signal or photo-carriers generated by the NIR optical signal to the readout circuit 324. The photodiode 300 may be one of the photodiodes in the sensor layer 108 as described in reference to FIG. 1, for example.

The photodiode 300 includes a p−Si substrate 302, a p−Si region 304, an n−si region 306, an intrinsic GeSi region 310, a p+ GeSi region 312, a gate 314, an n+ Si region 316, a gate control signal 322 coupled to the gate 314, a sensor control signal 326 coupled to the p+ GeSi region 312, and a readout circuit 324 coupled to the n+ Si region 316. In some implementations, the first absorption region for converting a visible optical signal to photo-carriers may include the p−Si region 304 and the n−Si region 306. The n−Si region 306 may be lightly doped with an n-dopant, e.g., phosphorus. The p−si region 304 may be lightly doped with a p-dopant, e.g., boron. In some implementations, the second absorption region for converting a NIR optical signal to photo-carriers may include the intrinsic GeSi region 310 and the p+ GeSi region 312. The p+ GeSi region 312 may have a p+ doping, where the dopant concentration may be as high as a fabrication process may achieve, e.g., about $5 \times 10^{20}$ cm$^{-3}$ when the intrinsic GeSi region 310 is germanium and doped with boron. Here, the intrinsic GeSi region 310 is a germanium-silicon mesa. The p−Si substrate 302 may be lightly doped with a p-dopant, e.g., boron.

In general, the first absorption region of the photodiode 300 receives the optical signal 320. The optical signal 320 may be a visible optical signal or an NIR optical signal similar to the optical signal 220 as described in reference to FIG. 2. In the case where the optical signal 320 is a visible optical signal, the first absorption region may absorb the visible optical signal and generate photo-carriers. In the case where the optical signal 320 is a NIR optical signal, the first absorption region may be transparent or nearly transparent to the NIR optical signal, and the second absorption region may absorb the NIR optical signal and generate photo-carriers. The sensor control signal 326 may control whether the photodiode 300 operates in a visible light mode or in a NIR light mode when a tunable wavelength filter is applied.

In the visible light mode, the optical signal 320 is a visible optical signal, where the first absorption region absorbs the visible optical signal and generates photo-carriers. A built-in potential between the p−Si region 304 and the n−Si region 306 creates an electric field between the two regions, where free electrons generated from the n−Si region 306 are drifted/diffused to a region below the p−Si region 304 by the electric field. The p−Si region 304 is configured to repel the free-electrons in the intrinsic GeSi region 310 from entering the first absorption region, such that the dark current of the photodiode 300 may be reduced. The sensor control signal 326 is configured to be able to apply a first sensor control signal level to further prevent free-electrons in the intrinsic GeSi region 310 from entering the first absorption region, such that the dark current of the photodiode 300 may be further reduced. For example, the first sensor control signal level may be 0V, such that an energy band difference between the p−Si region 304 and the intrinsic GeSi region 310 further prevents free-electrons in the intrinsic GeSi region 310 from entering the p−Si region 304. In some implementations, an i-Si or unintentionally doped Si layer may be inserted between the n−Si layer 304 and p−Si layer 306 to increase the optical absorption of the first absorption region.

The gate 314 may be coupled to the gate control signal 322. The gate control signal 322 controls a flow of free electrons from the region below the p−Si region 304 to the n+ Si region 316. For example, if a voltage of the gate control signal 322 exceeds a threshold voltage, free electrons accumulated in the region below the p+ Si region 304 will drift or diffuse to the n+ Si region 316. The n+ Si region 316 may be coupled to the readout circuit 324. The readout circuit 324 may be similar to the readout circuit 224 as described in reference to FIG. 2.

In the NIR light mode, the optical signal 320 is a NIR optical signal, where the optical signal 320 passes through the first absorption region because of the low NIR absorption coefficient of silicon, and the second absorption region then absorbs the NIR optical signal to generate photo-carriers. In general, the intrinsic GeSi region 310 receives an optical signal 320 and converts the optical signal 320 into electrical signals. The p+ GeSi region 312 may repel the photo-electrons generated from the intrinsic GeSi region 310 to avoid surface recombination and thereby may increase the carrier collection efficiency.

In the NIR light mode, the sensor control signal 326 is configured to apply a second sensor control signal level to allow free-electrons in the intrinsic GeSi region 310 to enter the first absorption region. For example, the second sensor control signal level may be −1.2,such that the p−Si region 304 is depleted, and the free-electrons in the intrinsic GeSi region 310 may enter the n−Si region 306. The free-electrons collected in the n−Si region 306 may be transferred to the readout circuit 324 by controlling the gate control signal 322 in similar manners as described earlier in reference to the visible mode.

Although not shown in FIG. 3, in some other implementations, the first absorption region and the second absorption region of the photodiode 300 may alternatively be designed into opposite polarity to collect holes. In this case, the p−Si substrate 302 would be replaced by an n−Si substrate, the p−Si region 304 would be replaced by an n−Si region, the n−Si region 306 would be replaced by a p−Si region, the p−Si substrate 302 would be replaced by an n−Si substrate, the n+ Si region 316 would be replaced by a p+ Si region, and the p+ GeSi region 312 would be replaced by an n+ GeSi region.

FIG. 4 illustrates an example photodiode 400 having a punch-through structure for detecting visible and near-infrared optical signals. In general, the example photodiodes 400 includes a first absorption region for converting a visible optical signal to photo-carriers and a second absorption region for converting a NIR optical signal to photo-carriers. A sensor control signal 426 may control the transfer of either photo-carriers generated by the visible optical signal or photo-carriers generated by the NIR optical signal to the readout circuit 424. The photodiode 400 may be one of the photodiodes in the sensor layer 108 as described in reference to FIG. 1, for example.

The photodiode 400 includes a p-Si substrate 402, a p+ Si region 404, an n-si region 406, a p-Si region 408, an intrinsic GeSi region 410, a p+ GeSi region 412, a gate 414, an n+ Si region 416, a gate control signal 422 coupled to the gate 414, a sensor control signal 426 coupled to the p+ GeSi region 412, and a readout circuit 424 coupled to the n+ Si region 416. In some implementations, the first absorption region for converting a visible optical signal to photo-carriers may include the p+ Si region 404, the n-Si region 406, and the p-Si region 408. The p+ Si region 404, the n-Si region 406, and the p-Si region 408 are similar to the p+ Si region 204, the n-Si region 206, and the p-Si region 208 as described in reference to FIG. 2. In some implementations, the second absorption region for converting a NIR optical signal to photo-carriers may include the intrinsic GeSi region 410 and the p+ GeSi region 412. The p+ GeSi region 412 may have a p+ doping, where the dopant concentration may be as high as a fabrication process may achieve, e.g., about $5 \times 10^{20}$ cm$^{-3}$ when the intrinsic GeSi region 410 is germanium and doped with boron. Here, the intrinsic GeSi region 410 is a mesa structure that is surrounded by an insulator layer 430, and may be fabricated by a selective Ge epitaxial growth.

In general, the first absorption region of the photodiode 400 receives the optical signal 420. The optical signal 420 may be a visible optical signal or an NIR optical signal similar to the optical signal 220 as described in reference to FIG. 2. In the case where the optical signal 420 is a visible optical signal, the first absorption region may absorb the visible optical signal and generate photo-carriers. In the case where the optical signal 420 is a NIR optical signal, the first absorption region may be transparent or nearly transparent to the NIR optical signal, and the second absorption region may absorb the NIR optical signal and generate photo-carriers. The sensor control signal 426 may control whether the photodiode 400 operates in a visible light mode or in a NIR light mode similar to the visible light mode and the NIR light mode operations described in reference to FIG. 2.

Although not shown in FIG. 4, in some other implementations, the first absorption region and the second absorption region of the photodiode 400 may alternatively be designed into opposite polarity to collect holes. In this case, the p-Si substrate 402 would be replaced by an n-Si substrate, the p+ Si region 404 would be replaced by an n+ Si region, the n-Si region 406 would be replaced by a p-Si region, the p-Si region 408 would be replaced by an n-Si region, the p-Si substrate 402 would be replaced by an n-Si substrate, the n+ Si region 416 would be replaced by a p+ Si region, and the p+ GeSi region 412 would be replaced by an n+ GeSi region.

Figure 5:
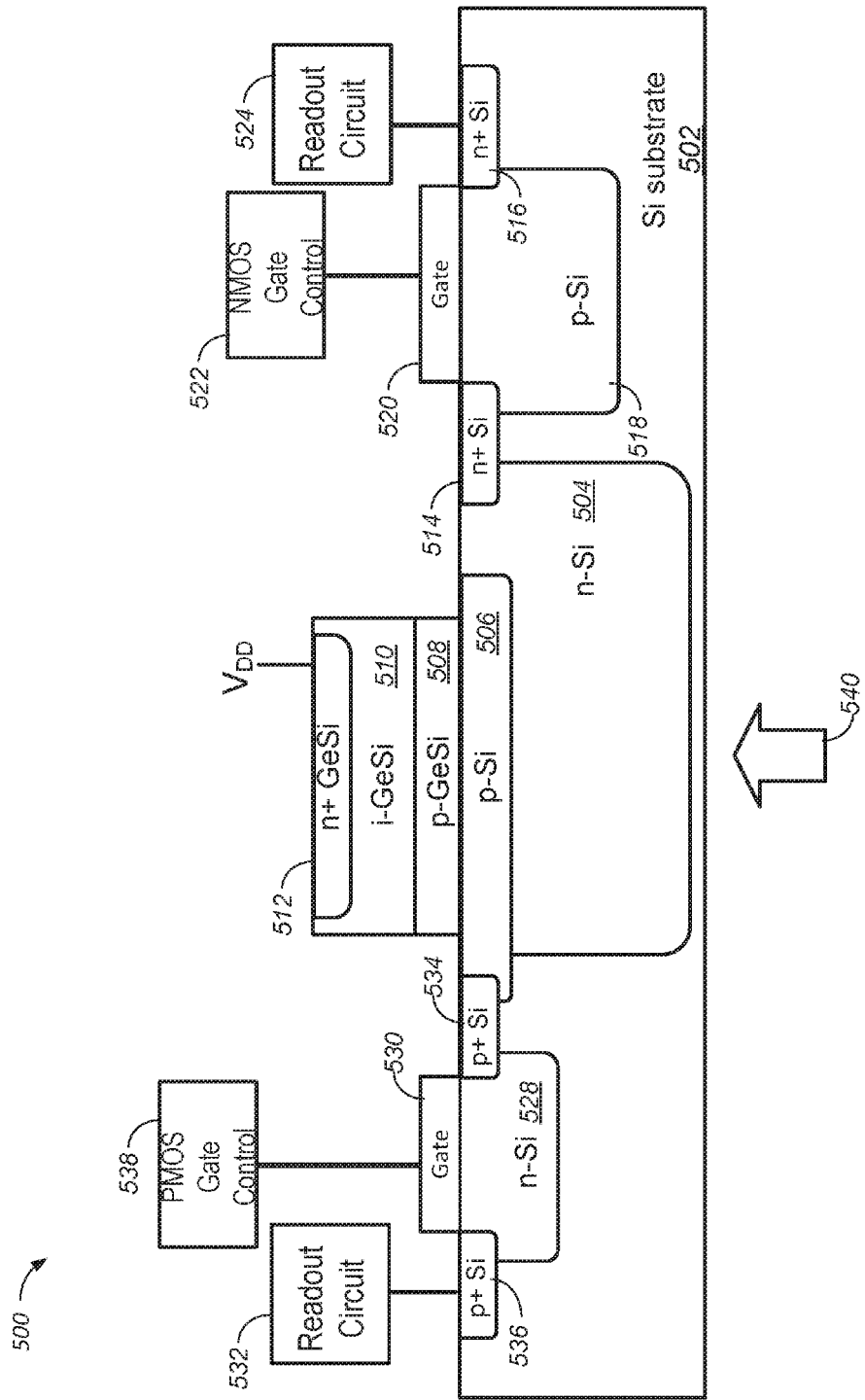
FIG. 5 is an example of a photodiode for detecting visible and/or NIR light.

FIG. 5 illustrates an example photodiode 500 having a hybrid structure for detecting visible and NIR optical signals. The example photodiodes 500 includes a first diode for converting a visible optical signal to photo-carriers, a second diode for converting a NIR optical signal to photo-carriers, an NMOS transistor for transporting the photo-carriers, primarily electrons, generated by the first diode to a first readout circuit, and a PMOS transistor for transporting the photo-carriers, primarily holes, generated by the second diode to a second readout circuit. The photodiode 500 may be one of the photodiodes in the sensor layer 108 as described in reference to FIG. 1, for example.

The first diode may include an n-Si region 504 and a p-Si region 506 fabricated in a p-Si substrate 502 that is lightly doped with a p-dopant, e.g., boron. The n-Si region 504 may be lightly doped with an n-dopant, e.g., phosphorus. The p-Si region 506 may be lightly doped with a p-dopant, e.g., boron. The NMOS transistor may include a first n+ Si region 514, a p-Si region 518, a second n+ Si region 516, and an NMOS gate 520. An NMOS gate control signal 522 may be coupled to the NMOS gate 520, and a first readout circuit 524 may be coupled to the second n+ Si region 516.

The second diode may include a p-GeSi region 508, an intrinsic GeSi region 510, and an n+ GeSi region 512. In some implementations, a thickness of the intrinsic GeSi region 510 may be between 0.05 μm to 2 μm. The n+ GeSi region 512 may have a n+ doping, where the dopant concentration may be as high as a fabrication process may achieve, e.g., about $5 \times 10^{20}$ cm$^{-3}$ when the intrinsic GeSi region 510 is germanium and doped with phosphorus. The p-GeSi region 508 may be lightly doped with a p-dopant, e.g., boron, when the intrinsic GeSi region 510 is germanium. The PMOS transistor may include a first p+ Si region 534, an n-Si region 528, a second p+ Si region 536, and a PMOS gate 530. A PMOS gate control signal 538 may be coupled to the PMOS gate 530, and a second readout circuit 532 may be coupled to the second p+Si region 536. Although not shown in FIG. 5, the n+ GeSi region 512 may have opposite polarity, namely become a p+ GeSi region to form a p-i-p vertical doping profile in the GeSi region.

Figure 6A:
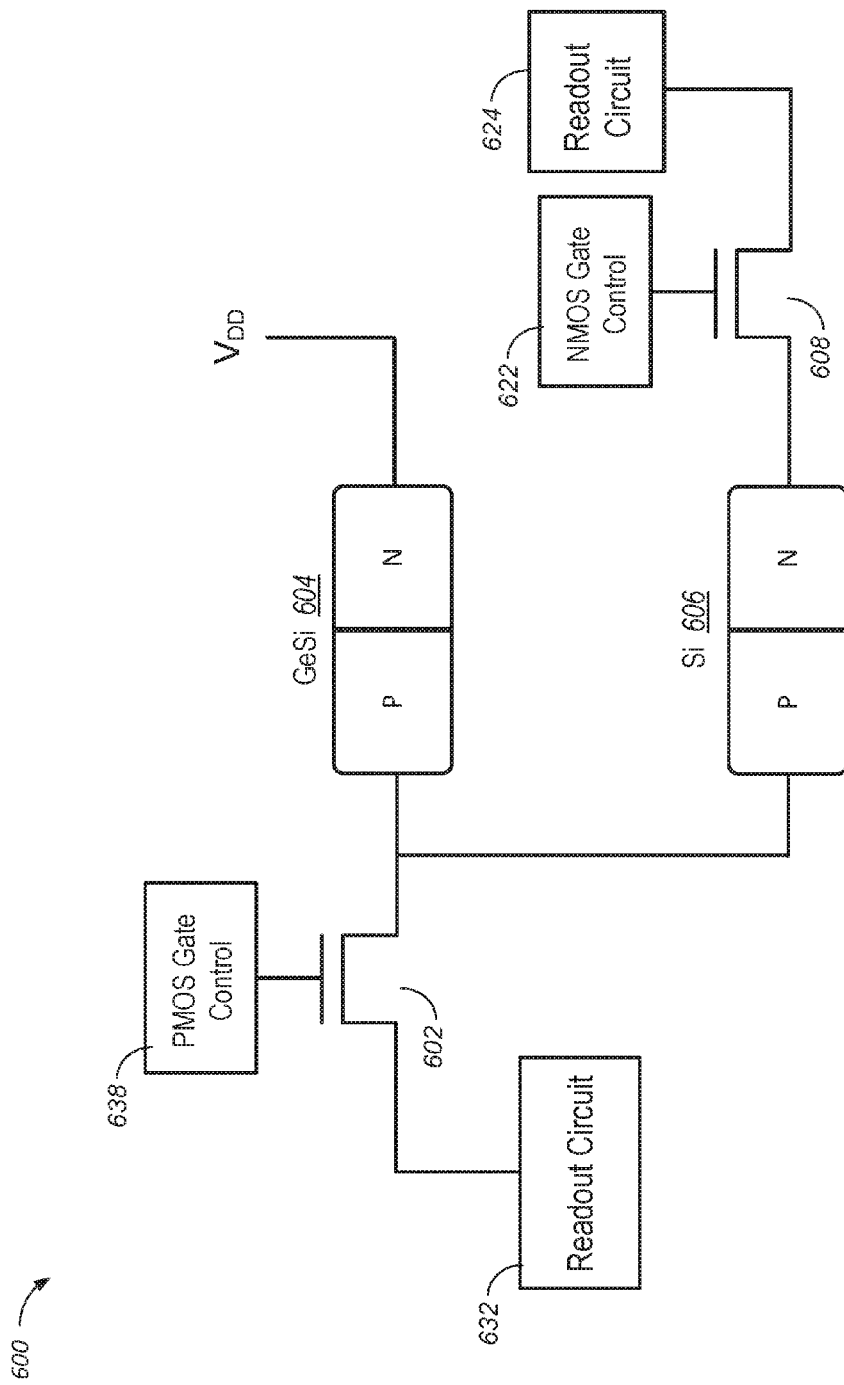
FIGS. 6A-6C are examples of a circuit schematic that represents the photodiode described in reference to FIG. 5.
Figure 6B:
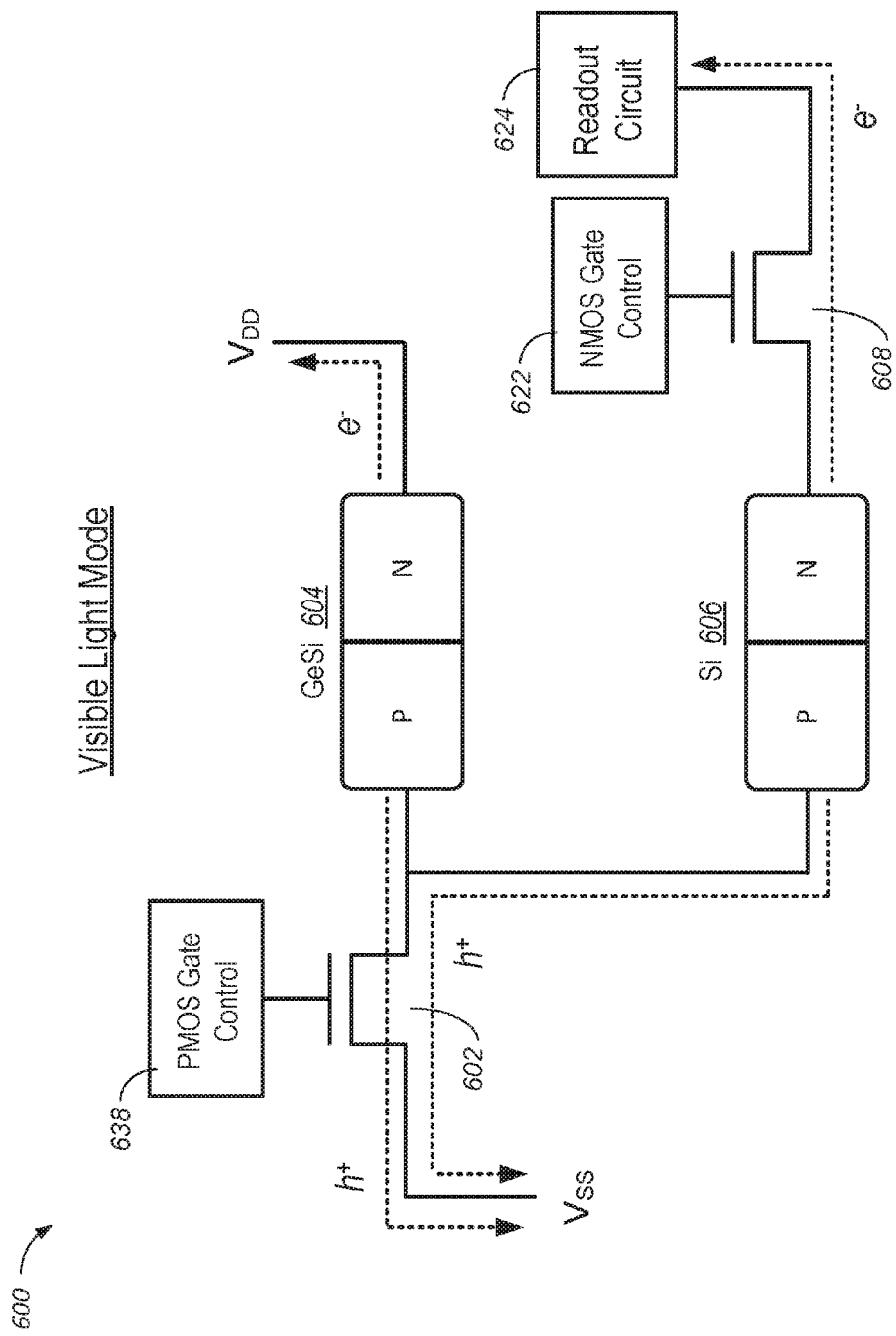
Figure 6C:
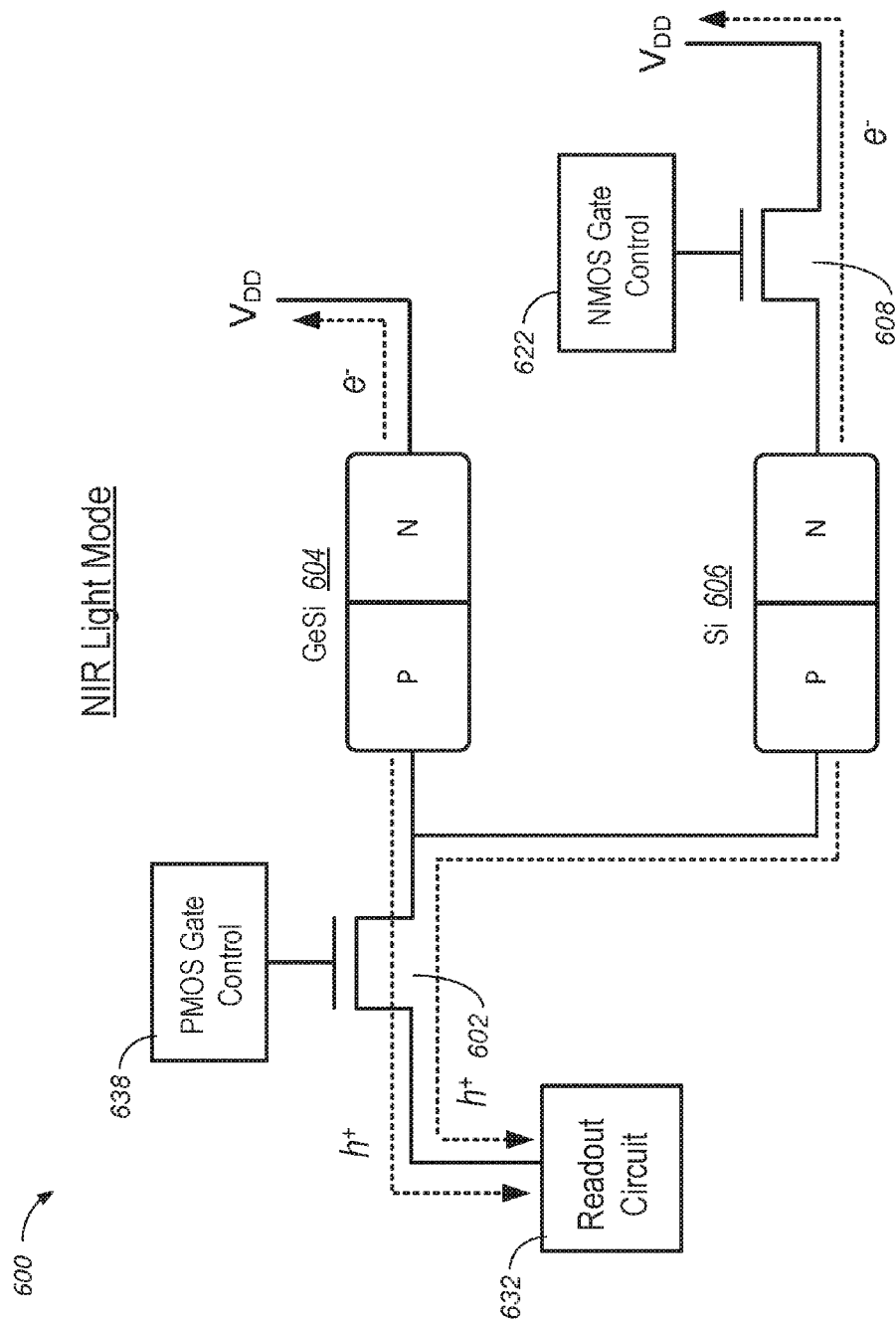

FIGS. 6A-6C illustrate an example circuitry 600 for illustrating operations of the photodiode 500 or other structures with similar device design concepts. Referring to FIG. 6A, the circuitry 600 includes a silicon diode 606, a germanium-silicon diode 604, a PMOS transistor 602, and a NMOS transistor 608, which may correspond to the first diode, the second diode, the PMOS transistor, and the NMOS transistor as described in reference to FIG. 5, respectively. The source of the NMOS transistor 608 is coupled to the n-end of the silicon diode 606, the drain of the NMOS transistor 608 is coupled to a first readout circuit 624, and the gate of the NMOS transistor 608 is coupled to an NMOS gate control signal 622. The source of the PMOS transistor 602 is coupled to the p-end of the silicon diode 606 and the p-end of the germanium-silicon diode 604, the drain of the PMOS transistor 602 is coupled to a second readout circuit 632, and the gate of the PMOS transistor 602 is coupled to a PMOS gate control signal 638. The v-end of the germanium silicon diode 604 is coupled to a voltage source $V_{DD}$. Although not shown in FIG. 6A, the first readout circuit 624 and the second readout circuit 632 may each be in a three-transistor configuration consisting of a reset gate, a source-follower, and a selection gate, or any suitable circuitry for processing free carriers.

Referring to FIG. 6B, in the visible light mode, the drain of the PMOS transistor 602 is coupled to a voltage source $V_{SS}$. This may be achieved by activating the reset gate of the second readout circuit 632 to couple the drain of the PMOS transistor 602 to the voltage source $V_{SS}$ of the second readout circuit 632. In the visible light mode, the silicon diode 606 absorbs the incoming optical signal and generates electron-hole pairs. For example, referring to FIG. 5, if the optical signal 540 is in the visible wavelength spectrum, the n–Si region 504 would absorb the optical signal 540 to generate electron-hole pairs. Example values of $V_{DD}$ and $V_{SS}$ may be 1.2V and −1.2V.

Referring back to FIG. 6B, the free electrons generated by the silicon diode 606 may be transferred to the first readout circuit 624 by turning on the NMOS transistor 608 using the NMOS gate control signal 622. For example, referring to FIG. 5, by turning on the NMOS gate 520 using the NMOS gate control signal 522, the free electrons accumulated in the n–Si region 504 may be transferred from the first n+ Si region 514 to the second n+ Si region 516, where the first readout circuit 524 may collect, store, and process the electrons.

Referring back to FIG. 6B, the free holes generated by the silicon diode 606 may be transferred to the voltage source $V_{SS}$ by turning on the PMOS transistor 602 using the PMOS gate control signal 638. In general, it is desirable to minimize or eliminate the noise-current, such as the dark-current, from the germanium-silicon diode 604 in the visible light mode because the dark-current of a germanium-silicon photodiode is generally much greater than the dark-current of a silicon photodiode. Since the n-end of the germanium-silicon diode 604 is coupled to a voltage source $V_{DD}$, the free electrons generated by the germanium-silicon diode 604 would be transferred to the voltage source $V_{DD}$. Similarly, since the p-end of the germanium-silicon diode 604 is coupled to a voltage source $V_{SS}$ by letting the PMOS transistor on, the free holes generated by the germanium-silicon diode 604 would be transferred to the voltage source $V_{SS}$. Consequently, the photo-carriers generated by the germanium-silicon diode 604 would not be transferred to the first readout circuit 624, thereby improving the overall performance of photodiode 600 in the visible light mode.

Referring to FIG. 6C, in the NIR light mode, the drain of the NMOS transistor 608 is coupled to a voltage source $V_{DD}$. This may be achieved by activating the reset gate of the first readout circuit 624 to couple the drain of the NMOS transistor 608 to the voltage source $V_{DD}$ of the first readout circuit 624. In the NIR light mode, the germanium-silicon diode 604 absorbs the incoming optical signal and generates electron-hole pairs. For example, referring to FIG. 5, if the optical signal 540 is in the NIR wavelength spectrum, the n–Si region 504 and the p–Si region 506 would be transparent to the optical signal 540, and the intrinsic GeSi region 510 would absorb the optical signal 540 to generate electron-hole pairs. Example values of $V_{DD}$ may be 1.2V.

Referring back to FIG. 6C, the free holes generated by the germanium-silicon diode 604 may be transferred to the second readout circuit 632 by turning on the PMOS transistor 602 using the PMOS gate control signal 638. For example, referring to FIG. 5, by turning on the PMOS gate 530 using the PMOS gate control signal 538, the free holes accumulated in the p–Si region 506 may be transferred from the first p+ Si region 534 to the second p+ Si region 536, where the second readout circuit 532 may collect, store, and process the holes.

Referring back to FIG. 6C, the free electrons generated by the germanium-silicon diode 604 may be transferred to the voltage source $V_{DD}$ that is coupled to the n-end of the germanium-silicon diode 604. Since the p-end of the silicon diode 606 is coupled to the PMOS transistor 602, the free holes generated by the silicon diode 606 would also be transferred to the second readout circuit 632. This is acceptable because the dark current of a silicon diode is generally much smaller than the dark current of a germanium-silicon diode. Since the n-end of the silicon diode 606 is coupled to a voltage source $V_{DD}$ by letting the NMOS transistor on, the free electrons generated by the silicon diode 608 would be transferred to the voltage source $V_{DD}$.

Although not shown in FIGS. 5 and 6A, in some other implementations, the first diode (e.g., the silicon diode 606) and the second diode (e.g., the germanium-silicon diode 604) may alternatively be designed into opposite polarity to collect holes and electrons, respectively. In this case, the p–Si substrate 502 would be replaced by an n–si substrate, the p–Si region 506 would be replaced by an n–Si region, the n–Si region 504 would be replaced by a p–Si region, the p+ GeSi region 512 would be replaced by an n+ GeSi region, the p-GeSi region 508 would be replaced by an n-GeSi region, the NMOS transistor would be replaced by a PMOS transistor, and the PMOS transistor would be replaced by an NMOS transistor. In some other implementations, the first diode and the second diode may be fabricated using other types of materials. For example, the second diode may be fabricated by a germanium-tin alloy to detect IR wavelength spectrum.

Figure 7:
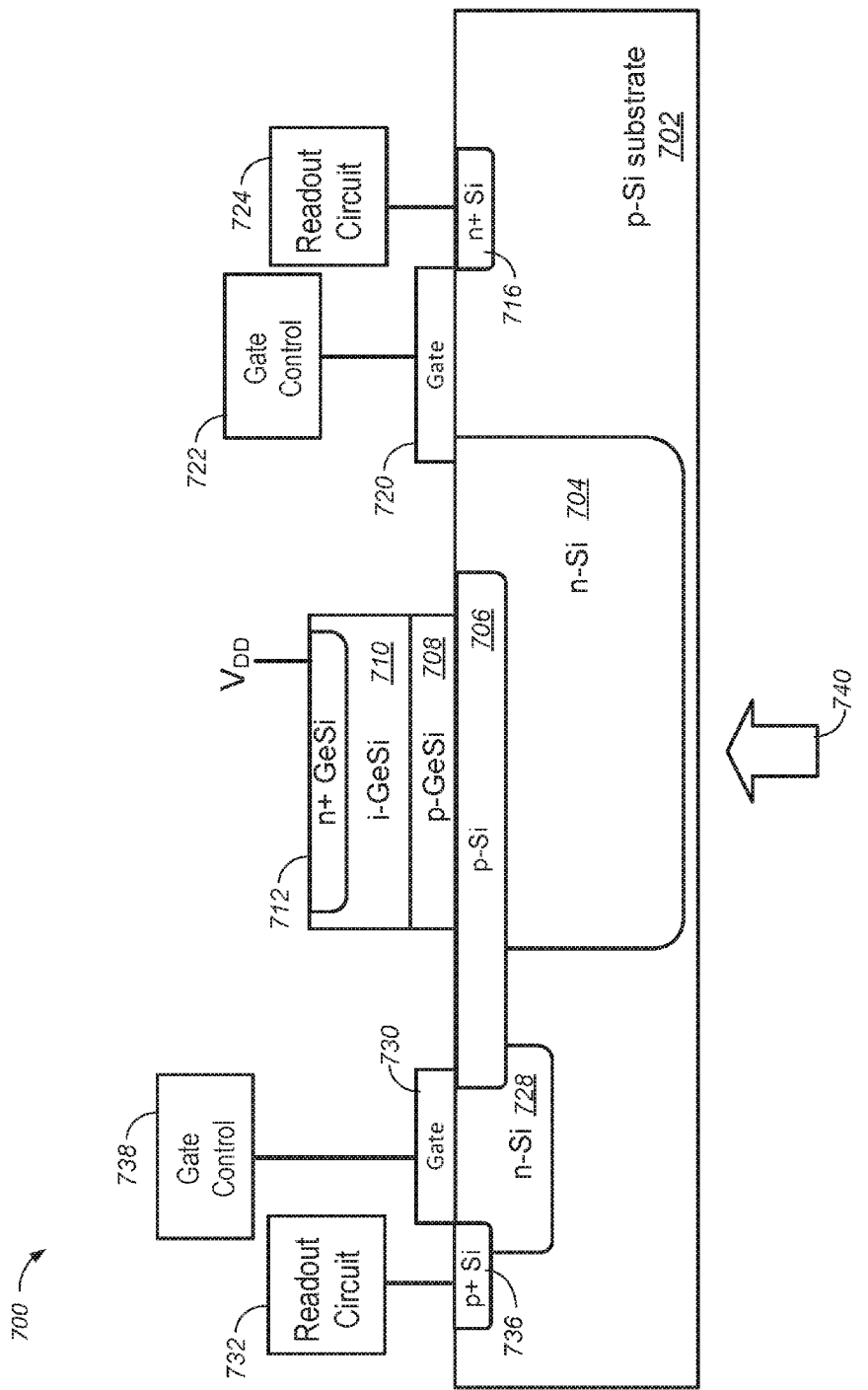
FIGS. 7-10 are examples of a multi-gate photodiode for detecting visible and/or NIR light.

FIG. 7 illustrates an example photodiode 700 having a hybrid structure for detecting visible and NIR optical signals. The example photodiodes 700 includes a first absorption region for converting a visible optical signal to photo-carriers, and a second absorption region for converting a NIR optical signal to photo-carriers. A first gate control signal 722 controls the transfer of free-electrons generated by the first absorption region to a first readout circuit 724, and a second gate control signal 738 controls the transfer of free-holes generated by the second absorption region to a second readout circuit 732. The photodiode 700 may be one of the photodiodes in the sensor layer 108 as described in reference to FIG. 1, for example.

In some implementations, the first absorption region may include an n–Si region 704 and a p–Si region 706 fabricated in a p–Si substrate 702 that may be lightly doped with a p-dopant, e.g., boron. The n–Si region 704 may be lightly doped with an n–dopant, e.g., phosphorus. The p–Si region 706 may be lightly doped with a p-dopant, e.g., boron. The second absorption region may include a p-GeSi region 708, an intrinsic GeSi region 710, and an n+ GeSi region 712. In some implementations, a thickness of the intrinsic GeSi region 710 may be between 0.05 μm to 2 μm. The n+ GeSi region 712 may have a n+ doping, where the dopant concentration may be as high as a fabrication process may achieve, e.g., about $5 \times 10^{20}$ cm$^{-3}$ when the intrinsic GeSi region 710 is germanium and doped with phosphorus. The p-GeSi region 708 may be lightly doped with a p-dopant, e.g., boron, when the intrinsic GeSi region 710 is germanium.

In general, the n–Si layer 704 receives an optical signal 740. If the optical signal 740 is a visible optical signal, the n–Si region 704 absorbs the optical signal 740 and converts the optical signal 740 into free carriers. A built-in potential between the p–Si region 706 and the n–Si region 704 creates an electric field between the two regions, where free electrons generated from the n–Si region 704 are drifted/diffused towards the region below the p–Si region 706 by the electric field.

A first gate 720 may be coupled to the first gate control signal 722. For example, the first gate 720 may be coupled to a voltage source, where the first gate control signal 722 may be a time-varying voltage signal from the voltage source. The first gate control signal 722 controls a flow of free electrons from the region below the p–si region 706 to the n+ Si region 716. For example, if a voltage of the control signal 722 exceeds a threshold voltage, free electrons accumulated in the region below the p–Si region 706 will drift or diffuse to the n+ Si region 716 for collection. The n+ Si region 716 may be coupled to the first readout circuit 724 that processes the collected electrical signal. The first readout circuit 724 may be similar to the readout circuit 224 as described in reference to FIG. 2.

If the optical signal 740 is a NIR optical signal, the NIR optical signal propagates through the first absorption region and is received by the second absorption region. The second absorption region receives the NIR optical signal and converts the NIR optical signal into electrical signals. Since the thickness of the p-GeSi region 708 is generally thin (e.g., 50-150 nm), the optical signal 740 propagates into the intrinsic GeSi region 710, where the intrinsic GeSi region 710 absorbs the optical signal 740 and converts the optical signal 740 into free carriers. The n+ GeSi region 712 may repel the holes generated from the intrinsic GeSi region 710 to avoid surface recombination and thereby may increase the carrier collection efficiency.

The photo-generated free holes in the intrinsic GeSi region 710 may drift or diffuse into the p–Si region 706. The photo-generated free electrons in the intrinsic GeSi region 710 may be repelled by the p-GeSi region 708, which prevents the free electrons from entering the p–Si region 706. In some implementations, a drain supply voltage $V_{DD}$ may be coupled to the n+ GeSi region 712 to create an electric field within the second absorption region, such that the free holes may drift or diffuse towards the p–Si region 706 while the free electrons may transport to the $V_{DD}$ voltage source.

The second gate 730 may be coupled to the second gate control signal 738. For example, the second gate 730 may be coupled to a voltage source, where the second gate control signal 738 may be a time-varying voltage signal from the voltage source. The second gate control signal 738 controls a flow of free holes from the p–si region 706 to the p+ Si region 736. For example, if a voltage of the second gate control signal 738 exceeds a threshold voltage, free holes accumulated in the p–Si region 706 will drift or diffuse towards the p+ Si region 736. The p+ Si region 736 may be coupled to the second readout circuit 732 for further processing of the collected electrical signal.

Although not shown in FIG. 7, in some other implementations, the first absorption region and the second absorption region may alternatively be designed into opposite polarity to collect holes and electrons, respectively. In this case, the p–si substrate 702 would be replaced by an n–Si substrate, the p–Si region 706 would be replaced by an n–Si region, the n–Si region 704 would be replaced by a p–Si region, the n+ GeSi region 712 would be replaced by an p+ GeSi region, the p+ GeSi region 708 would be replaced by a n+ GeSi region, the n+ Si region 716 would be replaced by a p+region, the n–Si region 728 would be replaced by a p–Si region, and the p+ Si region 736 would be replaced by an n+ region. Although not shown in FIG. 7, in some implementations, the n+ GeSi region 712 may have different polarity, namely become a p+ GeSi region to form a p-i-p vertical doping profile in the GeSi regions.

Figure 8:
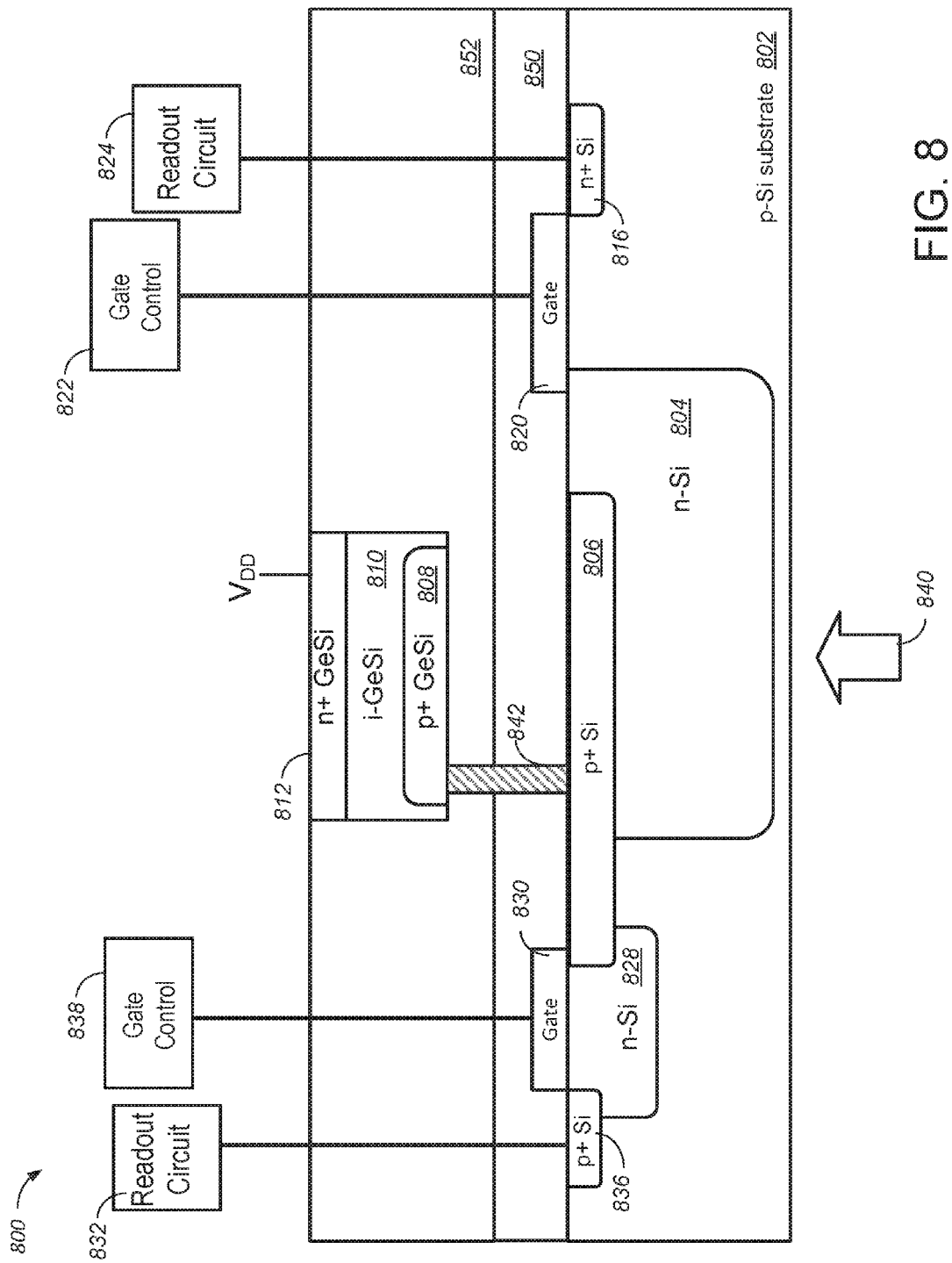

FIG. 8 illustrates an example photodiode 800 having a hybrid structure for detecting visible and NIR optical signals. Similar to the example photodiodes 700 as described in reference to FIG. 7, the photodiode 800 includes a first absorption region for converting a visible optical signal to photo-carriers, and a second absorption region for converting a NIR optical signal to photo-carriers. A first gate control signal 822 controls the transfer of free-electrons generated by the first absorption region to a first readout circuit 824, and a second gate control signal 838 controls the transfer of free-holes generated by the second absorption region to a second readout circuit 832. The photodiode 800 may be one of the photodiodes in the sensor layer 108 as described in reference to FIG. 1, for example.

In some implementations, the first absorption region may include an n–Si region 804 and a p+ Si region 806 fabricated in a p–Si substrate 802. The second absorption region may include a p+ GeSi region 808, an intrinsic GeSi region 810, and an n+ GeSi region 812. The first absorption region and the second absorption region are bonded using a first donor wafer 850 and a second donor wafer 852, and the first absorption region and the second absorption region are electrically coupled by one or more interconnects 842.

If the optical signal 840 is a visible optical signal, the operations of the photodiode 800 is similar to the operations of the photodiode 700 as described in reference to FIG. 7. If the optical signal 840 is a NIR optical signal, the NIR optical signal propagates through the first absorption region, the first donor wafer 850, and the second donor wafer 852, and is received by the second absorption region. The second absorption region receives the NIR optical signal and converts the NIR optical signal into electrical signals. Since the thickness of the p+ GeSi region 808 is generally thin (e.g., 50-150 nm), the optical signal 840 propagates into the intrinsic GeSi region 810, where the intrinsic GeSi region 810 absorbs the optical signal 840 and converts the optical signal 840 into free carriers. The n+ GeSi region 812 may repel the holes generated from the intrinsic GeSi region 810 to avoid surface recombination and thereby may increase the carrier collection efficiency. The photo-generated free holes in the intrinsic GeSi region 810 may transport to the p–Si region 806 via the one or more interconnects 842. The photo-generated free electrons in the intrinsic GeSi region 810 may be repelled by the p+ GeSi region 808, which prevents the free electrons from entering the p+ Si region 806.

In some implementations, a drain supply voltage $V_{DD}$ may be coupled to the n+ GeSi region 812 to create an electric field within the second absorption region, such that the free holes may drift or diffuse towards the p+ Si region 806 via the interconnects 842 while the free electrons may transport to the $V_{DD}$ voltage source. The second gate 830 may be coupled to the second gate control signal 838. The second gate control signal 838 controls a flow of free holes from the p+ Si region 806 to the p+ Si region 836. The p+ Si region 836 may be coupled to the second readout circuit 832 for further processing of the collected electrical signal.

Although not shown in FIG. 8, in some other implementations, the first absorption region and the second absorption region may alternatively be designed into opposite polarity to collect holes and electrons, respectively. In this case, the p–Si substrate 802 would be replaced by an n–Si substrate, the p+ Si region 806 would be replaced by an n+ Si region, the n–Si region 804 would be replaced by a p–Si region, the n+ GeSi region 812 would be replaced by a p+ GeSi region, the p+ GeSi region 808 would be replaced by an n+ GeSi region, the n+ Si region 816 would be replaced by a p+ region, the n–Si region 828 would be replaced by a p–Si region, and the p+ Si region 836 would be replaced by an n+ region.

Figure 9:
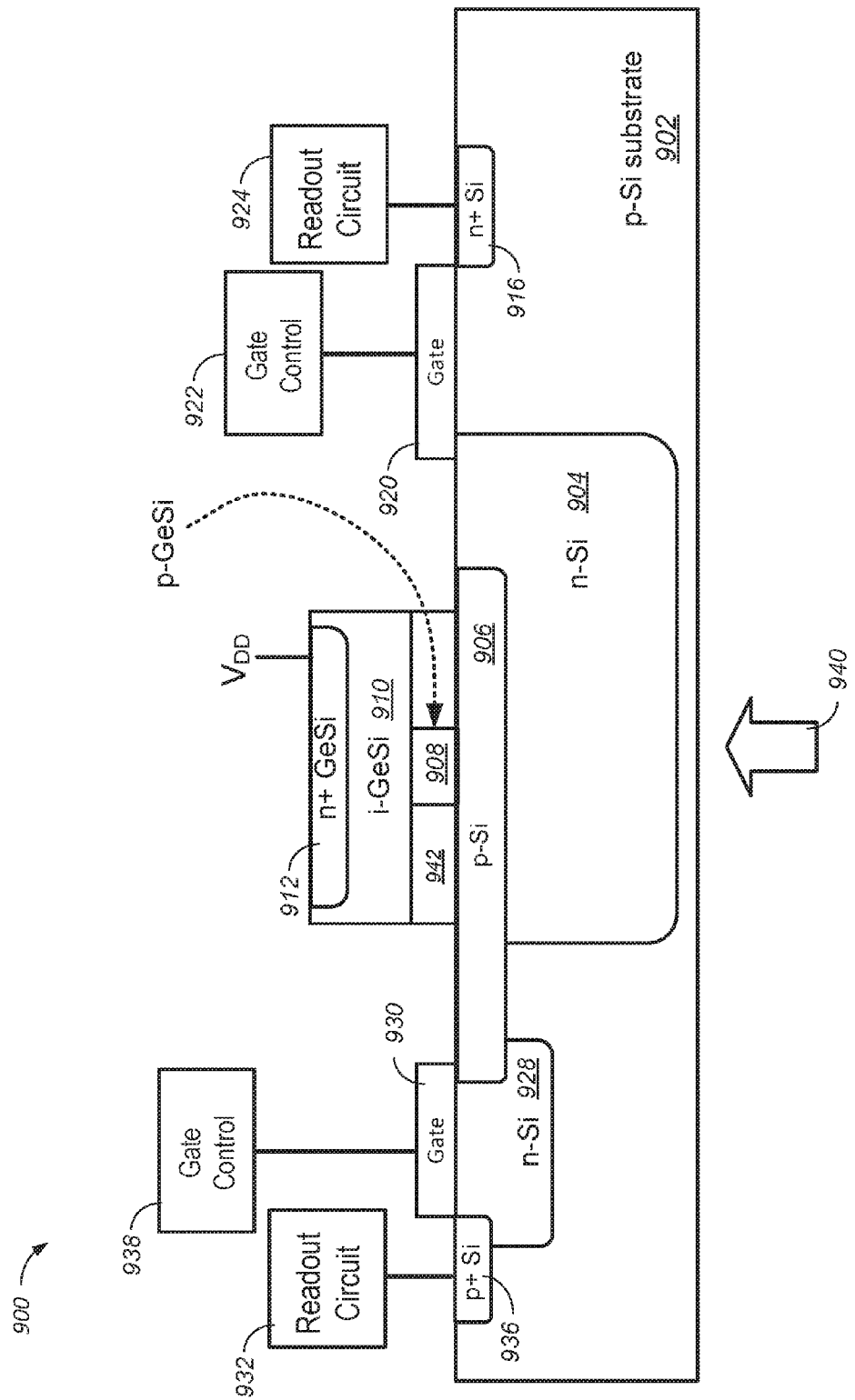

FIG. 9 illustrates an example photodiode 900 having a hybrid structure for detecting visible and NIR optical signals. Similar to the example photodiodes 700 as described in reference to FIG. 7, the photodiode 900 includes a first absorption region for converting a visible optical signal to photo-carriers, and a second absorption region for converting a NIR optical signal to photo-carriers. A first gate control signal 922 controls the transfer of free-electrons generated by the first absorption region to a first readout circuit 924, and a second gate control signal 938 controls the transfer of free-holes generated by the second absorption region to a second readout circuit 932. The photodiode 900 may be one of the photodiodes in the sensor layer 108 as described in reference to FIG. 1, for example.

In some implementations, the first absorption region may include an n-Si region 904 and a p-Si region 906 fabricated in a p-Si substrate 902. The second absorption region may include a p-GeSi region 908, an intrinsic GeSi region 910, and an n+ GeSi region 912. The p-GeSi region 908 may be formed in an etched region of an insulator layer 942 (e.g., oxide) using a lateral strain dilution technique or an aspect ratio trapping technique for forming a germanium or germanium-silicon mesa having reduced defects or being defect-free, which results into a lower dark current and a better sensitivity/dynamic range. The lateral strain dilution technique is described in U.S. patent application Ser. No. 15/216,924 titled "High Efficiency Wide Spectrum Sensor," which is fully incorporated by reference herein.

If the optical signal 940 is a visible optical signal, the operations of the photodiode 900 is similar to the operations of the photodiode 700 as described in reference to FIG. 7. If the optical signal 940 is a NIR optical signal, the NIR optical signal propagates through the first absorption region, and is received by the second absorption region. The second absorption region receives the NIR optical signal and converts the NIR optical signal into electrical signals. Since the thickness of the p-GeSi region 908 is generally thin (e.g., 50-150 nm), the optical signal 940 propagates into the intrinsic GeSi region 910, where the intrinsic GeSi region 910 absorbs the optical signal 940 and converts the optical signal 940 into free carriers. The n+ GeSi region 912 may repel the holes generated from the intrinsic GeSi region 910 to avoid surface recombination and thereby may increase the carrier collection efficiency. The photo-generated free holes in the intrinsic GeSi region 910 may transport to the p-Si region 906 via the p-GeSi region 908. The photo-generated free electrons in the intrinsic GeSi region 910 may be repelled by the p-GeSi region 908, which prevents the free electrons from entering the p-Si region 906.

In some implementations, a drain supply voltage $V_{DD}$ may be coupled to the n+ GeSi region 912 to create an electric field within the second absorption region, such that the free holes may drift or diffuse towards the p-Si region 906 via the p-GeSi region 908 while the free electrons may transport to the $V_{DD}$ voltage source. The second gate 930 may be coupled to the second gate control signal 938. The second gate control signal 938 controls a flow of free holes from the p-Si region 906 to the p+ Si region 936. The p+ Si region 936 may be coupled to the second readout circuit 932 for further processing of the collected electrical signal.

Although not shown in FIG. 9, in some other implementations, the first absorption region and the second absorption region may alternatively be designed into opposite polarity to collect holes and electrons, respectively. In this case, the p-si substrate 902 would be replaced by an n-Si substrate, the p-Si region 906 would be replaced by an n-Si region, the n-Si region 904 would be replaced by a p-Si region, the n+ GeSi region 912 would be replaced by a p+ GeSi region, the p-GeSi region 908 would be replaced by an n-GeSi region, the n+ Si region 916 would be replaced by a p+ region, the n-Si region 928 would be replaced by a p-Si region, and the p+ Si region 936 would be replaced by an n+ region.

Figure 10:
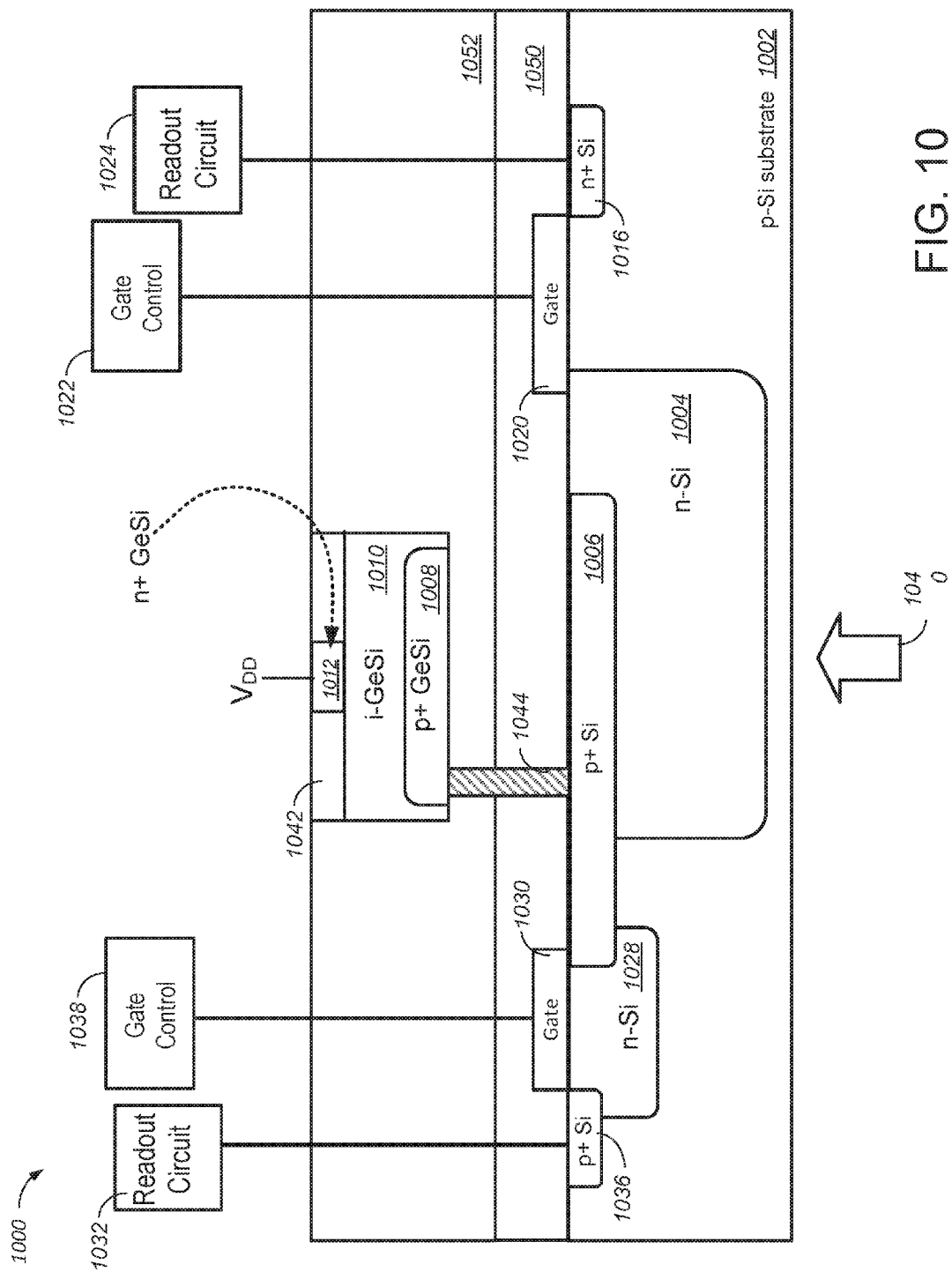

FIG. 10 illustrates an example photodiode 1000 having a hybrid structure for detecting visible and NIR optical signals. Similar to the example photodiodes 700 as described in reference to FIG. 7, the photodiode 1000 includes a first absorption region for converting a visible optical signal to photo-carriers, and a second absorption region for converting a NIR optical signal to photo-carriers. A first gate control signal 1022 controls the transfer of free-electrons generated by the first absorption region to a first readout circuit 1024, and a second gate control signal 1038 controls the transfer of free-holes generated by the second absorption region to a second readout circuit 1032. The photodiode 1000 may be one of the photodiodes in the sensor layer 108 as described in reference to FIG. 1, for example.

In some implementations, the first absorption region may include an n-Si region 1004 and a p+ Si region 1006 fabricated in a p-Si substrate 1002. The second absorption region may include a p+ GeSi region 1008, an intrinsic GeSi region 1010, and an n+ GeSi region 1012. The first absorption region and the second absorption region are bonded using a first donor wafer 1050 and a second donor wafer 1052, and the first absorption region and the second absorption region are electrically coupled by one or more interconnects 1044. The n+ GeSi region 1012 may be formed in an etched region of an insulator layer (e.g., oxide) 1042 using a lateral strain dilution technique or an aspect ratio trapping technique for forming a germanium or germanium-silicon mesa having reduced defects or being defect-free, which results into a lower dark current and a better sensitivity/dynamic range. The lateral strain dilution technique is described in U.S. patent application Ser. No. 15/216,924 titled "High Efficiency Wide Spectrum Sensor," which is fully incorporated by reference herein.

If the optical signal 1040 is a visible optical signal, the operations of the photodiode 1000 is similar to the operations of the photodiode 700 as described in reference to FIG. 7. If the optical signal 1040 is a NIR optical signal, the NIR optical signal propagates through the first absorption region, and is received by the second absorption region. The second absorption region receives the NIR optical signal and converts the NIR optical signal into electrical signals. Since the thickness of the p+ GeSi region 1008 is generally thin (e.g., 50-150 nm), the optical signal 1040 propagates into the intrinsic GeSi region 1010, where the intrinsic GeSi region 1010 absorbs the optical signal 1040 and converts the optical signal 1040 into free carriers. The n+ GeSi region 1012 and the insulator layer 1042 may repel the holes generated from the intrinsic GeSi region 1010 to avoid surface recombination and thereby may increase the carrier collection efficiency. The photo-generated free holes in the intrinsic GeSi region 1010 may transport to the p+ Si region 1006 via the one or more interconnects 1044. The photo-generated free electrons in the intrinsic GeSi region 1010 may be repelled by the p+ GeSi region 1008, which prevents the free electrons from entering the p+ Si region 1006.

In some implementations, a drain supply voltage $V_{DD}$ may be coupled to the n+ GeSi region 1012 to create an electric field within the second absorption region, such that the free holes may drift or diffuse towards the p+ Si region 1006 via the one or more interconnects 1044 while the free electrons may transport to the $V_{DD}$ voltage source. The second gate 1030 may be coupled to the second gate control signal 1038. The second gate control signal 1038 controls a flow of free holes from the p+ Si region 1006 to the p+ Si region 1036. The p+ Si region 1036 may be coupled to the second readout circuit 1032 for further processing of the collected electrical signal.

Although not shown in FIG. 10, in some other implementations, the first absorption region and the second absorption region may alternatively be designed into opposite polarity to collect holes and electrons, respectively. In this case, the p-si substrate 1002 would be replaced by an n-Si substrate, the p+ Si region 1006 would be replaced by an n+ Si region, the n-Si region 1004 would be replaced by a p-Si region, the n+ GeSi region 1012 would be replaced by a p+ GeSi region, the p+ GeSi region 1008 would be replaced by an n+ GeSi region, the n+ Si region 1016 would be replaced by a p+ region, the n-Si region 1028 would be replaced by a p-Si region, and the p+ Si region 1036 would be replaced by an n+ region.

Figure 11:
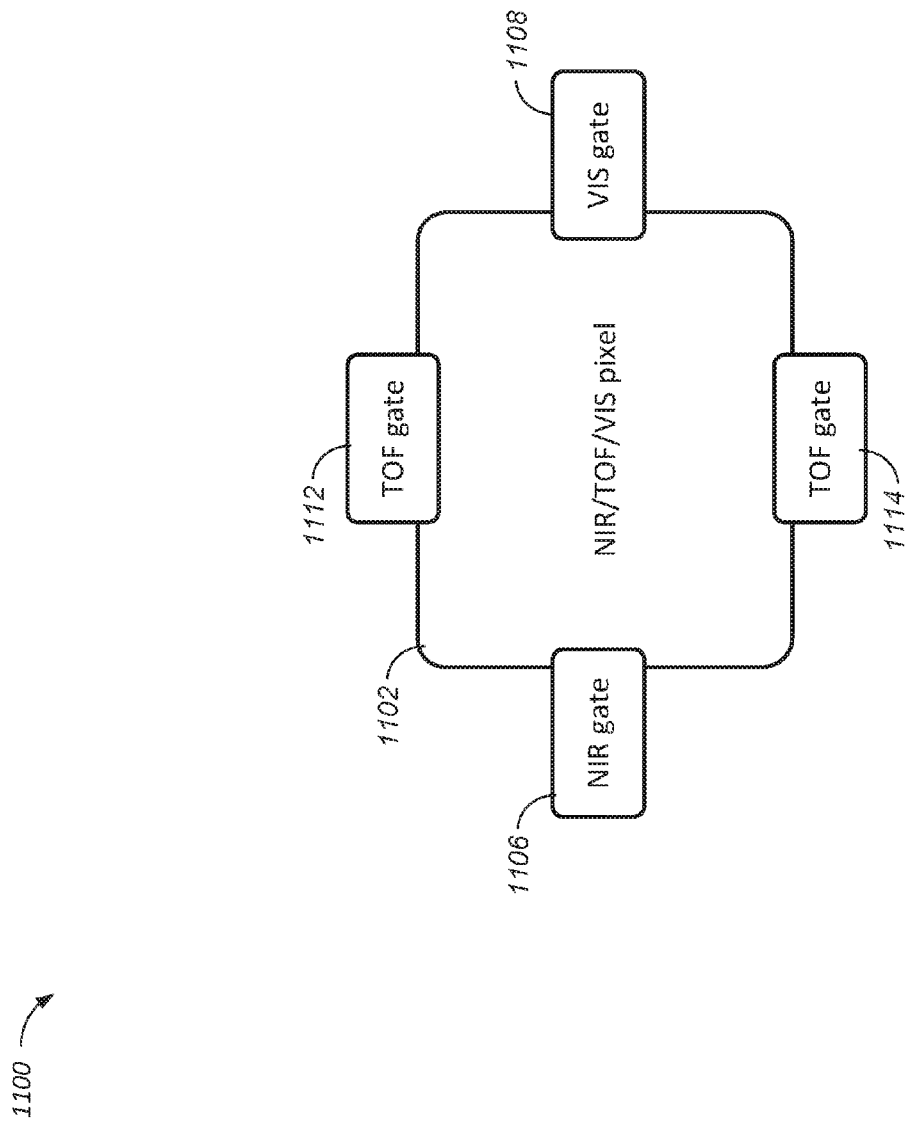
FIG. 11 is an example of an integrated photodiode for detecting visible and/or NIR light.

FIG. 11 shows a top view of an example integrated photodiode array 1100 for detecting visible and NIR light as well as for a TOF application. The photodiode array 1100 includes a NIR/TOF/VIS pixel 1102. The NIR/TOF/VIS pixel 1102 includes an NIR gate 1106, a first TOF gate 1112, a second TOF gate 1114, and a VIS gate 1108. The controls of the charge readout using the NIR gate 1106 and the VIS gate 1108 are similar to the multi-gate photodiode 200, 300, 400, 500, 700, 800, 900, or 1000 as described in reference to FIG. 2, FIG. 3, FIG. 4, FIG. 5, FIG. 7, FIG. 8, FIG. 9, or FIG. 10, respectively. The controls of the charge readout using the TOF gates 1112 and 1114 are similar to the multi-gate photodiode 1500 as described in reference to FIG. 15 and also are described in U.S. patent application Ser. No. 15/228,282 titled "Germanium-Silicon Light Sensing Apparatus," which is fully incorporated by reference herein. The readout circuits coupled to the NIR gate 1106 and the TOF gates 1112 and 1114 would collect the same type of carriers, and the readout circuit coupled to the VIS gate 1108 would collect the opposite type of carriers. For example, if the readout circuits of the NIR gate 1106 and the TOF gates 1112 and 1114 are configured to collect electrons, the readout circuit coupled to the VIS gate 1108 would be configured to collect holes. Conversely, if the readout circuits of the NIR gate 1106 and the TOF gates 1112 and 1114 are configured to collect holes, the readout circuit coupled to the VIS gate 1108 would be configured to collect electrons.

Figure 12:
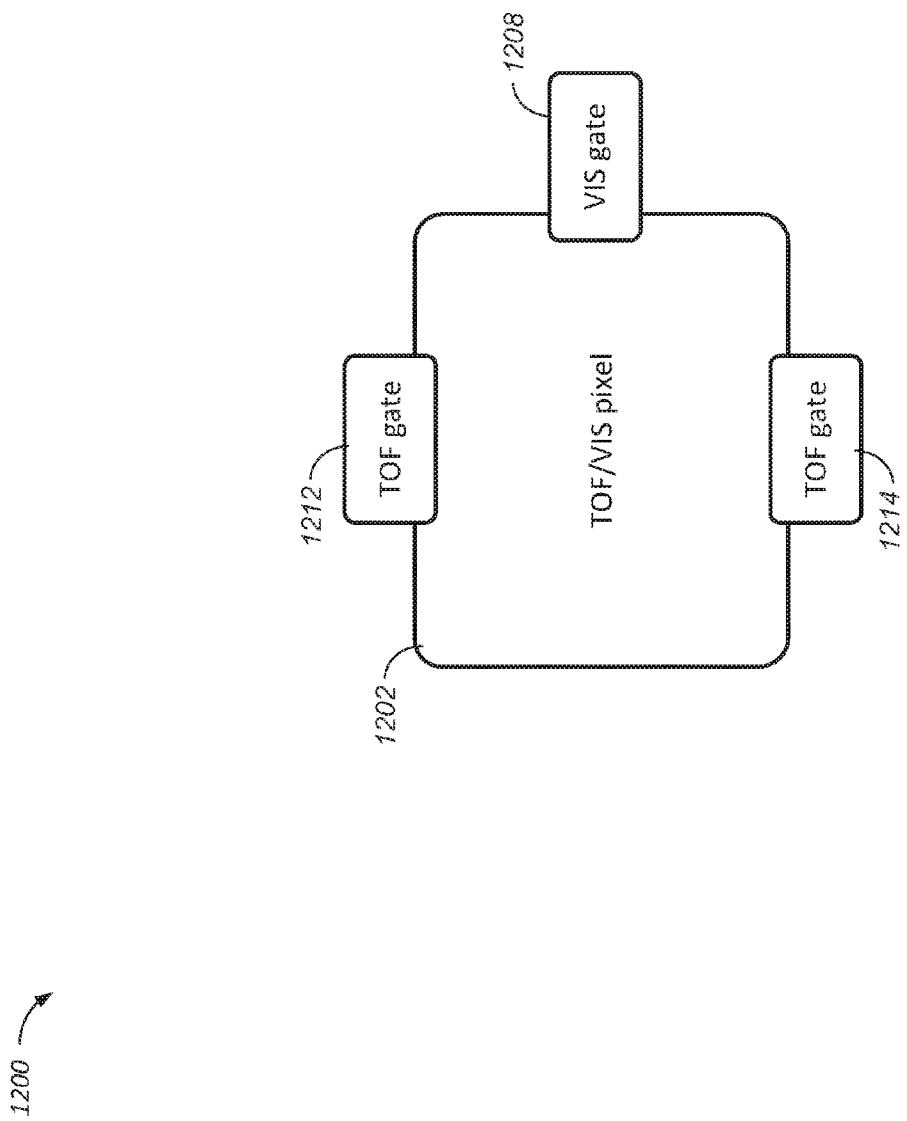
FIG. 12 is an example of an integrated photodiode for detecting visible and/or NIR light.

FIG. 12 shows a top view of an example integrated photodiode array 1200 for detecting visible light and for a TOF application. The photodiode array 1200 includes a TOF/VIS pixel 1202. The TOF/VIS pixel 1202 includes a first TOF gate 1212, a second TOF gate 1214, and a VIS gate 1208. The controls of the charge readout using the VIS gate 1208 are similar to the multi-gate photodiode 200, 300, 400, 500, 700, 800, 900, or 1000 as described in reference to FIG. 2, FIG. 3, FIG. 4, FIG. 5, FIG. 7, FIG. 8, FIG. 9, or FIG. 10, respectively. The controls of the charge readout using the TOF gates 1212 and 1214 are similar to the multi-gate photodiode 1500 as described in reference to FIG. 15 and also are described in U.S. patent application Ser. No. 15/228, 282 titled "Germanium-Silicon Light Sensing Apparatus," which is fully incorporated by reference herein. The readout circuits coupled to the TOF gates 1212 and 1214 would collect the same type of carriers, and the readout circuit coupled to the VIS gate 1208 would collect the opposite type of carriers. For example, if the readout circuits of the TOF gates 1212 and 1214 are configured to collect electrons, the readout circuit coupled to the VIS gate 1208 would be configured to collect holes. Conversely, if the readout circuits of the TOF gates 1212 and 1214 are configured to collect holes, the readout circuit coupled to the VIS gate 1208 would be configured to collect electrons.

FIG. 13 illustrates example photodiodes 1300 for detecting visible and near-infrared optical signals. The example photodiodes 1300 includes an NIR pixel 1350 for collecting holes and a visible pixel 1352 for collecting electrons, where the NIR pixel 1350 and the visible pixel 1352 are formed on a common substrate. The NIR pixel 1350 and the visible pixel 1352 may not be separated by an isolation structure. The NIR pixel 1350 is configured to detect an optical signal having a wavelength in the NIR range. The visible pixel 1352 is configured to detect an optical signal having a wavelength in the visible range (e.g., blue and/or green and/or red). The NIR pixel 1350 and the visible pixel 1352 may be photodiodes in the sensor layer 108 as described in reference to FIG. 1, for example.

The visible pixel 1350 is configured to collect free electrons generated from photo-generated carriers, and includes an n-Si region 1304, an n+ Si region 1316, an p-si region 1306, a first gate 1320, a first gate control signal 1322 coupled to the first gate 1320, and a first readout circuit 1324 coupled to the n+ Si region 1316. In general, the p-Si layer 1306 receives a visible optical signal 1342. Since the thickness of the p-si layer 1306 is generally thin (e.g., 50-150 nm), the optical signal 1342 propagates into the n-Si region 1304, where the n-Si region 1304 absorbs the optical signal 1342 and converts the optical signal 1342 into free carriers. In some implementations, the optical signal 1342 may be filtered by a wavelength filter not shown in this figure, such as a filter in the filter layer 110 as described in reference to FIG. 1. In some implementations, a beam profile of the optical signal 1342 may be shaped by a lens not shown in this figure, such as a lens in the lens layer 112 as described in reference to FIG. 1.

In general, a built-in potential between the p-Si region 1306 and the n-Si region 1304 creates an electric field between the two regions, where free electrons generated from the n-Si region 1304 are drifted/diffused towards the region below the p-Si region 1306 by the electric field. The first gate 1320 may be coupled to the first gate control signal 1322. For example, the first gate 1320 may be coupled to a voltage source, where the first gate control signal 1322 may be a time-varying voltage signal from the voltage source. The first gate control signal 1322 controls a flow of free electrons from the region below the p-Si region 1306 to the n+ Si region 1316. For example, if a voltage of the first gate control signal 1322 exceeds a threshold voltage, free electrons accumulated in the region below the p-Si region 1306 will drift or diffuse to the n+ Si region 1316 for collection. The n+ Si region 1316 may be coupled to the first readout circuit 1324 that processes the collected electrical signal. The first readout circuit 1324 may be similar to the readout circuit 224 as described in reference to FIG. 2.

The NIR pixel 1350 is configured to collect free holes generated from photo-generated carriers, and includes an n-Si region 1328, a p+ Si region 1336, a second gate 1330, a second gate control signal 1338 coupled to the second gate 1330, a second readout circuit 1332 coupled to the p+ Si region 1336, a n+ GeSi region 1312, an intrinsic GeSi region 1310, and a p-Ge region 1308. In addition, the NIR pixel 1350 shares the p-Si region 1306 with the VIS pixel 1352, but the germanium-silicon mesa may not be formed on the n-Si region 1304.

The n+ GeSi region 1312 receives a NIR optical signal 1340 and converts the NIR optical signal 1340 into electrical signals. Since the thickness of the n+ GeSi layer 1312 is generally thin (e.g., 50-150 nm), the optical signal 1340 propagates into the intrinsic GeSi region 1310, where the intrinsic GeSi region 1310 absorbs the optical signal 1340 and converts the optical signal 1340 into free carriers. In some implementations, a thickness of the intrinsic GeSi region 1310 may be between 0.05 µm to 2 µm. In some implementations, the n+ GeSi region 1312 may repel the holes generated from the intrinsic GeSi region 1310 to avoid surface recombination and thereby may increase the carrier collection efficiency.

The photo-generated free holes in the intrinsic GeSi region 1310 may drift or diffuse into the p–Si region 1306. The photo-generated free electrons in the intrinsic GeSi region 1310 may be repelled by the p-GeSi region 1308, which prevents the free electrons from entering the p–Si region 1306. In some implementations, a drain supply voltage $V_{DD}$ may be applied to the NIR pixel 1350 to create an electric field between the n+ GeSi region 1312 and the p–Si region 1308, such that the free holes may drift or diffuse towards the p–Si region 1306 while the free electrons may drift or diffuse towards the n+ GeSi region 1312.

The second gate 1330 may be coupled to the second gate control signal 1338. The second control signal 1338 controls a flow of free holes from the p–Si region 1306 to the p+ Si region 1336. For example, if a voltage of the second gate control signal 1338 exceeds a threshold voltage, free holes accumulated in the p–Si region 1306 will drift or diffuse towards the p+ Si region 1336. The p+ Si region 1336 may be coupled to the second readout circuit 1332 for further processing of the collected electrical signal.

Although not shown in FIG. 13, in some other implementations, the visible pixel 1352 may alternatively be designed into opposite polarity to collect holes instead of electrons and the NIR pixel 1350 may alternatively be designed into opposite polarity to collect electrons instead of holes. In this case, the p–Si substrate 1302 would be replaced by an n–Si substrate, the p–Si region 1306 would be replaced by an n–si region, the n–Si regions 1304 and 1328 would be replaced by p–Si regions, the p+ Si region 1336 would be replaced by an n+ Si region, the n+ Si region 1316 would be replaced by a p+ Si region, the n+ GeSi region 1312 would be replaced by a p+ GeSi region, and the p-GeSi region 1308 would be replaced by an n-GeSi region. In some implementations, the direction of light signal shown in FIG. 13 may be reversed depending on designs, packaging, and applications. For example, the NIR optical signal 1340 may enter the NIR pixel 1350 through the p–Si substrate 1302, and the visible optical signal 1342 may enter the visible pixel 1352 through the p–Si substrate 1302 and the n–Si region 1304.

FIG. 14 illustrates example photodiodes 1400 for detecting visible and near-infrared optical signals. Similar to the photodiodes 1300 as described in reference to FIG. 13, the example photodiodes 1400 includes an NIR pixel 1450 for collecting holes and a visible pixel 1452 for collecting electrons, where the NIR pixel 1450 and the visible pixel 1452 are formed on a common substrate. The visible pixel 1450 includes an n–Si region 1404, an n+ Si region 1416, an p–Si region 1406, a first gate 1420, a first gate control signal 1422 coupled to the first gate 1420, and a first readout circuit 1424 coupled to the n+ Si region 1416. The operations of the visible pixel 1450 is similar to the operations of the visible pixel 1350 as described in reference to FIG. 13.

The NIR pixel 1450 is configured to collect free holes generated from photo-generated carriers, and includes an n–Si region 1428, a p+ Si region 1436, a second gate 1430, a second gate control signal 1438 coupled to the second gate 1430, a second readout circuit 1432 coupled to the p+ Si region 1436, a n+ GeSi region 1412, an intrinsic GeSi region 1410, and a p-Ge region 1408. The p-GeSi region 1408 may be formed in an etched region of an insulator layer (e.g., oxide) 1442 using a lateral strain dilution technique or an aspect ratio trapping technique for forming a germanium or germanium-silicon mesa having reduced defects or being defect-free, which results into a lower dark current and a better sensitivity/dynamic range. The lateral strain dilution technique is described in U.S. patent application Ser. No. 15/216,924 titled "High Efficiency Wide Spectrum Sensor," which is fully incorporated by reference herein.

The n+ GeSi region 1412 receives a NIR optical signal 1440 and converts the NIR optical signal 1440 into electrical signals. Since the thickness of the n+ GeSi layer 1412 is generally thin (e.g., 50-150 nm), the optical signal 1440 propagates into the intrinsic GeSi region 1410, where the intrinsic GeSi region 1410 absorbs the optical signal 1440 and converts the optical signal 1440 into free carriers. In some implementations, a thickness of the intrinsic GeSi region 1410 may be between 0.05 µm to 2 µm. In some implementations, the n+ GeSi region 1412 may repel the holes generated from the intrinsic GeSi region 1410 to avoid surface recombination and thereby may increase the carrier collection efficiency.

The photo-generated free holes in the intrinsic GeSi region 1410 may drift or diffuse into the p–Si region 1406 via the p-GeSi region 1408. The photo-generated free electrons in the intrinsic GeSi region 1410 may be repelled by the p-GeSi region 1408, which prevents the free electrons from entering the p–Si region 1406. In some implementations, a drain supply voltage $V_{DD}$ may be applied to the NIR pixel 1450 to create an electric field between the n+ GeSi region 1412 and the p–Si region 1408, such that the free holes may drift or diffuse towards the p–Si region 1406 while the free electrons may drift or diffuse towards the n+ GeSi region 1412.

The second gate 1430 may be coupled to the second gate control signal 1438. The second control signal 1438 controls a flow of free holes from the p–Si region 1406 to the p+ Si region 1436. The p+ Si region 1436 may be coupled to the second readout circuit 1432 for further processing of the collected electrical signal.

Although not shown in FIG. 14, in some other implementations, the visible pixel 1452 may alternatively be designed into opposite polarity to collect holes instead of electrons and the NIR pixel 1450 may alternatively be designed into opposite polarity to collect electrons instead of holes. In this case, the p–Si substrate 1402 would be replaced by an n–Si substrate, the p–Si region 1406 would be replaced by an n–si region, the n–Si regions 1404 and 1428 would be replaced by p–Si regions, the p+ Si region 1436 would be replaced by an n+ Si region, the n+ Si region 1416 would be replaced by a p+ Si region, the n+ GeSi region 1412 would be replaced by a p+ GeSi region, and the p-GeSi region 1408 would be replaced by an n-GeSi region. In some implementations, the direction of light signal shown in FIG. 14 may be reversed depending on designs, packaging, and applications. For example, the NIR optical signal 1440 may enter the NIR pixel 1450 through the p–Si substrate 1402, and the visible optical signal 1442 may enter the visible pixel 1452 through the p–Si substrate 1402 and the n–Si region 1404.

Figure 15:
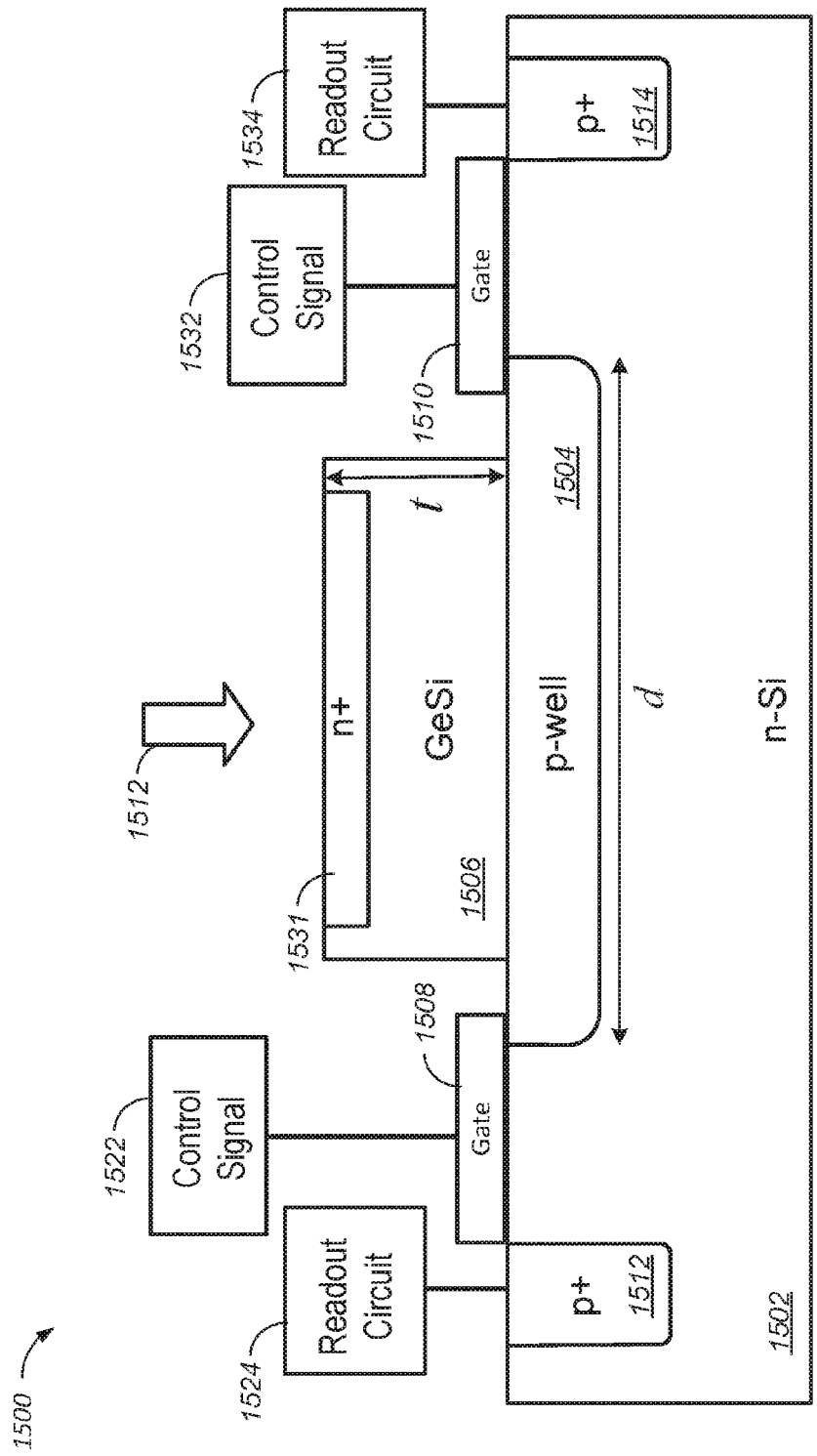
FIG. 15 is an example of a multi-gate photodiode.

FIG. 15 is an example multi-gate photodiode 1500 for converting an optical signal to an electrical signal. The multi-gate photodiode 1500 includes an absorption layer 1506 fabricated on a substrate 1502. The substrate 1502 may be any suitable substrate where semiconductor devices can be fabricated on. For example, the substrate 1502 may be a silicon substrate. The coupling between the absorption layer 1506 and a first p+ Si region 1512 is controlled by a first gate 1508. The coupling between the absorption layer 1506 and a second p+ Si region 1514 is controlled by a second gate 1510.

In general, the absorption layer 1506 receives an optical signal 1512 and converts the optical signal 1512 into electrical signals. Although not shown in FIG. 15, in some implementations, the direction of the optical signal 1512 may be reversed depending on designs, packaging, and applications. For example, the optical signal 1512 may enter the multi-gate photodiode 1500 through the substrate 1502. The absorption layer 1506 is selected to have a high absorption coefficient at the desired wavelength range. For NIR wavelengths, the absorption layer 1506 may be a GeSi mesa, where the GeSi absorbs photons in the optical signal 1512 and generates electron-hole pairs. The material composition of germanium and silicon in the GeSi mesa may be selected for specific processes or applications. In some implementations, the absorption layer 1506 is designed to have a thickness t. For example, for 850 nm wavelength, the thickness of the GeSi mesa may be approximately 1 μm to have a substantial quantum efficiency. In some implementations, the surface of the absorption layer 1506 is designed to have a specific shape. For example, the GeSi mesa may be circular, square, or rectangular depending on the spatial profile of the optical signal 1512 on the surface of the GeSi mesa. In some implementations, the absorption layer 1506 is designed to have a lateral dimension d for receiving the optical signal 1512. For example, the GeSi mesa may have a circular shape, where d can range from 1 μm to 50 μm.

In some implementations, the absorption layer 1506 may include an n+ GeSi region 1531. The n+ GeSi region 1531 may repel the holes from the surface of the absorption region 1506 and thereby may increase the device bandwidth. The multi-gate photodiode 1500 includes a p-well region 1504 implanted in the substrate 1502.

The first gate 1508 is coupled to a first gate control signal 1522 and a first readout circuit 1524. The second gate 1510 is coupled to a second control signal 1532 and a second readout circuit 1534. The first gate 1508, the first gate control signal 1522, the first readout circuit 1524, the second gate 1510, the second gate control signal 1532, and the second readout circuit 1534 are similar to the second gate 1428, the second gate control signal 1438, and the second readout circuit 1432 as described in reference to FIG. 14.

The first control signal 1522 and the second control signal 1532 are used to control the collection of holes generated by the absorbed photons. For example, when the first gate 1508 is turned "on" and the second gate 1510 is turned "off", holes would drift from the p-well region 1504 to the p+ Si region 1512. Conversely, when the first gate 1508 is turned "off" and the second gate 1510 is turned "on", holes would drift from the p-well region 1504 to the p+ Si region 1514. In some implementations, a voltage may be applied between the n+ GeSi region 1531 and the p-well 1504 to increase the electric field inside the absorption layer 1506 for drifting the holes towards the p-well region 1504.

Although not shown in FIG. 15, in some other implementations, the photodiode 1500 may alternatively be designed into opposite polarity to collect electrons. In this case, the n-Si region 1502 would be replaced by an n-Si region, the p-well region 1504 would be replaced by an n-well region, the p+ Si regions 1512 and 1514 would be replaced by n+ Si regions, and the n+ GeSi region 1531 would be replaced by a p+ GeSi region.

A number of implementations have been described. Nevertheless, it will be understood that various modifications may be made without departing from the spirit and scope of the disclosure. For example, for the example photodiodes described in this application, a germanium-silicon alloy may be replaced by a germanium-tin alloy for applications where longer operating wavelengths at the infrared region is required. As another example, for the example photodiodes described in this application, the germanium concentration of the germanium-silicon alloy may be varied based on application or process constraints and/or requirements. The drawings shown in this application are for illustration and working principle explanation purpose. For example, FIG. 2 does not limit that the orientation of the p+ GeSi region 212 to be at the bottom and the p+ Si region 204 to be at the top for packaging or operation purposes. Rather, the direction of the optical signal 220 would inform the orientation of the photodiode 200, i.e., the first absorption region would receive the optical signal 220 before the second absorption region.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:

1. An optical sensor comprising:
    a semiconductor substrate;
    a first light absorption region formed in the semiconductor substrate, the first light absorption region configured to absorb photons at a first wavelength range and to generate photo-carriers from the absorbed photons;
    a second light absorption region comprising an intrinsic region, the intrinsic region being formed on the first light absorption region, and the second light absorption region configured to absorb photons at a second wavelength range and to generate photo-carriers from the absorbed photons; and
a sensor control signal coupled to the second light absorption region, the sensor control signal configured to provide at least a first control level and a second control level,
wherein at the first control level, an energy band difference at an interface of the first light absorption region and the second light absorption region is above a threshold for blocking one specific polarity of the photo-carriers generated by the second light absorption region from entering the first light absorption region, and
wherein at the second control level, the energy band difference at the interface of the first light absorption region and the second light absorption region is below the threshold for blocking the one specific polarity of the photo-carriers generated by the second light absorption region from entering the first light absorption region.

2. The optical sensor of claim 1,
wherein the first light absorption region comprises:
an n-doped silicon region; and
a p-doped silicon region on the n-doped silicon region, and
wherein the intrinsic region of the second light absorption region includes germanium and is formed on the p-doped silicon region of the first light absorption region, and the second light absorption region comprises
a p-doped region including germanium on the intrinsic region.

3. The optical sensor of claim 2, further comprising:
an n-doped readout region coupled to a readout circuit; and
a gate coupled to a gate control signal, the gate configured to control a carrier transit between the first light absorption region and the n-doped readout region.

4. The optical sensor of claim 1, wherein the second light absorption region includes a mesa including germanium.

5. The optical sensor of claim 1, wherein the second light absorption region includes a film including germanium.

6. An optical sensor comprising:
a first diode formed using a first material, the first diode comprising an n-doped region and a p-doped region;
a NMOS transistor comprising:
a source region coupled to the n-doped region of the first diode;
a gate region coupled to a NMOS gate control signal; and
a drain region;
a second diode formed using a second material different from the first material, the second diode comprising:
an n-doped region coupled to a first bias signal; and
a p-doped region; and
a PMOS transistor comprising:
a source region coupled to the p-doped region of the first diode and the p-doped region of the second diode;
a gate region coupled to a PMOS gate control signal; and
a drain region,
wherein the drain region of the NMOS transistor is coupled to a first readout circuit, and the drain region of the PMOS transistor is coupled to a second readout circuit different from the first readout circuit.

7. The optical sensor of claim 6,
wherein the drain region of the PMOS transistor is coupled to a second bias source, such that (i) the first readout circuit collects, stores, and processes electrons generated by the first diode, (ii) the drain region of the PMOS transistor transfers holes generated by the first diode to the second bias source, and (iii) the drain region of the PMOS transistor transfers holes generated by the second diode to the second bias source.

8. The optical sensor of claim 7, wherein the first diode is configured to absorb light at visible wavelengths to generate electrons and holes.

9. The optical sensor of claim 6,
wherein the drain region of the NMOS transistor is coupled to a third bias source, such that (i) the drain region of the NMOS transistor transfers electrons generated by the first diode to the third bias source, (ii) the second readout circuit collects, stores, and processes holes generated by the first diode, and (iii) the second readout circuit collects, stores, and processes holes generated by the second diode.

10. The optical sensor of claim 9, wherein the second diode is configured to absorb light at near-infrared or infrared wavelengths to generate electrons and holes.

11. The optical sensor of claim 6, further comprising:
a substrate,
wherein the first diode, the NMOS transistor, and the PMOS transistor are formed in the substrate,
wherein the second diode further comprises an intrinsic region,
wherein the p-doped region of the second diode is on the p-doped region of the first diode,
wherein the intrinsic region of the second diode is on the p-doped region of the second diode, and
wherein the n-doped region of the second diode is on the intrinsic region of the second diode.

12. The optical sensor of claim 6, wherein the first diode is a diode including silicon and the second diode is a diode including germanium.

13. An optical sensor comprising:
a semiconductor substrate;
a first light absorption region formed in the semiconductor substrate, the first light absorption region configured to absorb photons at a first wavelength range and to generate photo-carriers from the absorbed photons, the first light absorption region comprising:
a first carrier-collection region configured to collect electrons; and
a second carrier-collection region configured to collect holes;
a second light absorption region on a portion of the first light absorption region, the second light absorption region configured to absorb photons at a second wavelength range and to generate photo-carriers from the absorbed photons;
a first readout region coupled to a first readout circuitry, the first readout region configured to provide the electrons collected by the first carrier-collection region to the first readout circuitry, wherein the electrons collected by the first carrier-collection region are provided by the first light absorption region;
a first gate coupled to a first control signal that controls a carrier transport between the first carrier-collection region and the first readout region;
a second readout region coupled to a second readout circuitry, the second readout region configured to provide the holes collected by the second carrier-collection region to the second readout circuitry, wherein the holes collected by the second carrier-collection region are provided by the second light absorption region; and a second gate coupled to a second control signal that controls a carrier transport between the second carrier-collection region and the second readout region.

14. The optical sensor of claim 13, wherein the second light absorption region comprises:

a p-doped region including germanium on the first light absorption region;

an intrinsic region including germanium on the p-doped region; and an n-doped region including germanium on the intrinsic region.

15. The optical sensor of claim 14, wherein the p-doped region including germanium has a first strain and a first area, and wherein the intrinsic region including germanium has a second strain that is lower than the first strain, and the intrinsic region including germanium has a second area that is larger than the first area.

16. The optical sensor of claim 14, wherein the second light absorption region is on a portion of the second carrier-collection region but not on the first carrier-collection region, wherein the first light absorption region and the second light absorption region are configured to receive light at different locations.

17. The optical sensor of claim 16, wherein the p-doped region including germanium has a first strain and a first area, and wherein the intrinsic region including germanium has a second strain that is lower than the first strain, and the intrinsic region including germanium has a second area that is larger than the first area.

18. The optical sensor of claim 14, wherein the first light absorption region and the second light absorption region are coupled by one or more interconnects formed by bonding two donor wafers.

19. The optical sensor of claim 18, wherein the n-doped region including germanium has a first strain and a first area, and wherein the intrinsic region including germanium has a second strain that is lower than the first strain, and the intrinsic region including germanium has a second area that is larger than the first area.

20. The optical sensor of claim 13, further comprising:

a third readout region coupled to a third readout circuitry, the third readout region configured to provide the holes collected by the second carrier-collection region to the third readout circuitry; and a third gate coupled to a third control signal that controls a carrier transport between the second carrier-collection region and the third readout region.

21. The optical sensor of claim 20, further comprising:

a fourth readout region coupled to a fourth readout circuitry, the fourth readout region configured to provide the holes collected by the second carrier-collection region to the fourth readout circuitry; and a fourth gate coupled to a fourth control signal that controls a carrier transport between the second carrier-collection region and the fourth readout region.

\* \* \* \* \*